United States Patent
Bird et al.

(10) Patent No.: US 6,944,023 B2
(45) Date of Patent: Sep. 13, 2005

(54) SYSTEM AND METHOD FOR MOUNTING A HEAT SINK

(75) Inventors: John Bird, Newton, NH (US); Paul Bussiere, Twin Mountain, NH (US); Lyne Doré-North, Chelmsford, MA (US); Amy Allen, Amesbury, MA (US); Ralph I. Larson, Bolton, MA (US)

(73) Assignee: Celestica International Inc., Toronto (CA)

( * ) Notice: Subject to any disclaimer, the term of this patent is extended or adjusted under 35 U.S.C. 154(b) by 0 days.

(21) Appl. No.: 10/681,945

(22) Filed: Oct. 10, 2003

(65) Prior Publication Data
US 2004/0095728 A1 May 20, 2004

Related U.S. Application Data

(60) Provisional application No. 60/426,910, filed on Nov. 15, 2002.

(51) Int. Cl.[7] .................................................. H05K 7/20
(52) U.S. Cl. ..................... 361/704; 361/719; 257/718; 257/727
(58) Field of Search ........................ 361/704, 707, 361/709–710, 714–719; 174/16.1, 16.3; 165/80.2, 185; 257/706, 707, 712, 713, 718, 719

(56) References Cited

U.S. PATENT DOCUMENTS

| | | | |
|---|---|---|---|
| 5,313,099 A | | 5/1994 | Tata et al. ................... 257/717 |
| 5,353,193 A | | 10/1994 | Chia et al. ................... 361/704 |
| 5,397,919 A | * | 3/1995 | Tata et al. ................... 257/717 |
| 5,579,827 A | * | 12/1996 | Chung ........................ 165/80.3 |
| 5,597,035 A | * | 1/1997 | Smith et al. ................ 165/80.3 |
| 5,630,469 A | * | 5/1997 | Butterbaugh et al. ....... 165/80.3 |
| 5,708,564 A | | 1/1998 | Lin ............................. 361/704 |
| 5,945,736 A | * | 8/1999 | Rife et al. ................... 257/719 |
| 6,014,315 A | * | 1/2000 | McCullough et al. ....... 361/704 |
| 6,021,045 A | * | 2/2000 | Johnson ...................... 361/704 |
| 6,293,331 B1 | * | 9/2001 | Wang ......................... 165/80.3 |
| 6,382,306 B1 | | 5/2002 | Hsu ............................ 165/80.3 |
| 6,452,803 B1 | * | 9/2002 | Liu ............................. 361/704 |
| 6,640,882 B2 | * | 11/2003 | Dowdy et al. ............. 165/80.3 |
| 2004/0159936 A1 | * | 8/2004 | Ficorilli et al. ............. 257/720 |

* cited by examiner

*Primary Examiner*—Boris Chervinsky
(74) *Attorney, Agent, or Firm*—Blake, Cassels & Graydon LLP

(57) ABSTRACT

The invention provides a heat sink assembly having a positionable heat sink permitting the heat sink to be mounted to a substrate in more than one configuration. Various features are described for permitting multiple degrees of freedom in the arrangement of the heat sink assembly. Such features permit the heat sink assembly to be adapted to different environments. The heat sink assembly also has features such as a vane for directing air flow relative to the heat sink. Features for varying and maintaining pressure between the heat sink and a component to be cooled are also included.

21 Claims, 13 Drawing Sheets

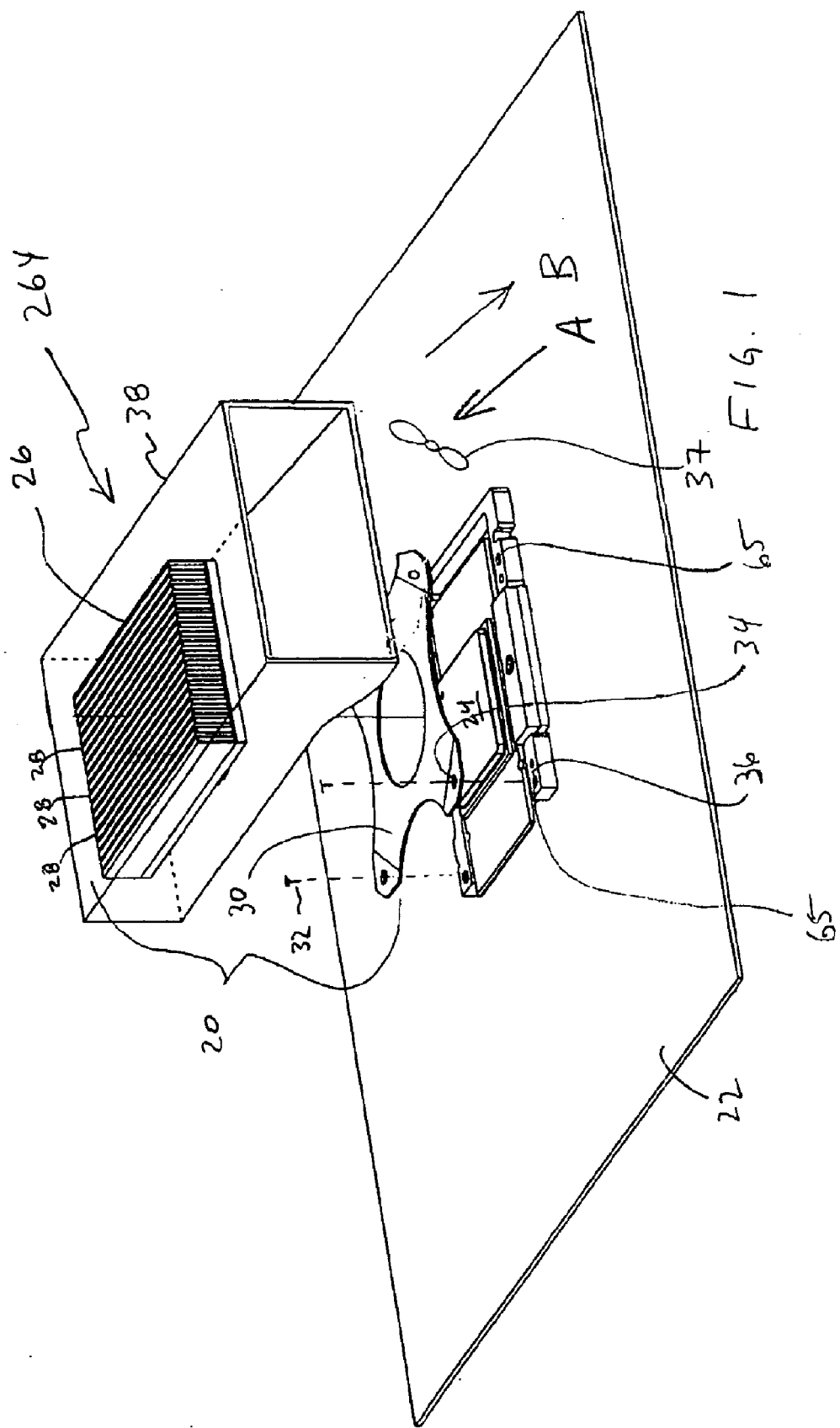

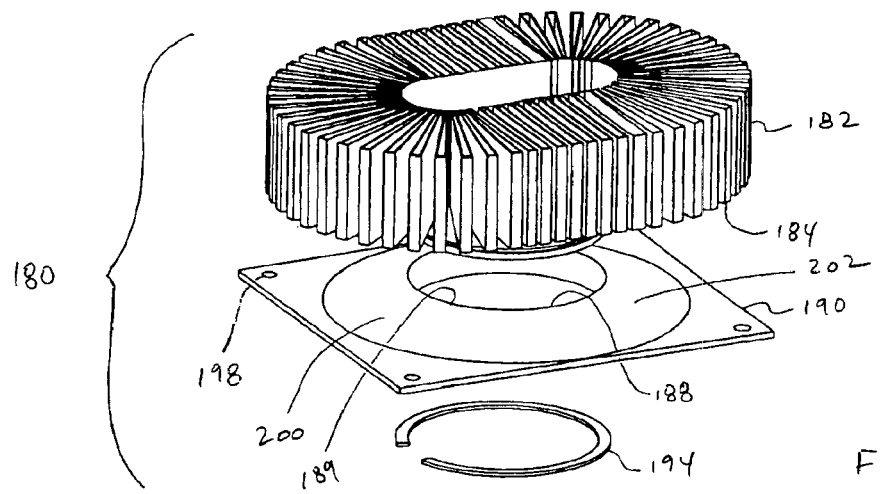
FIG 8A
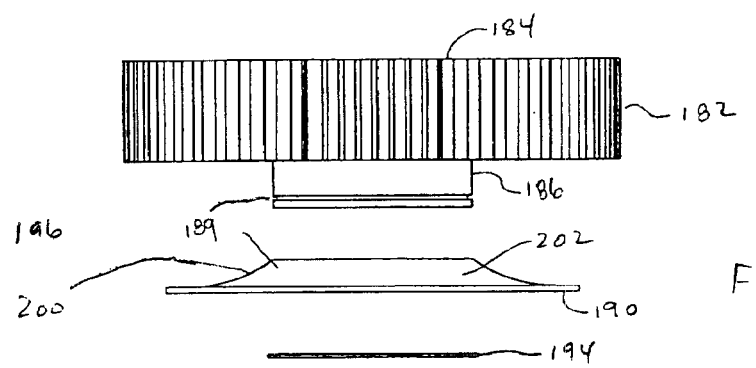
FIG 8B
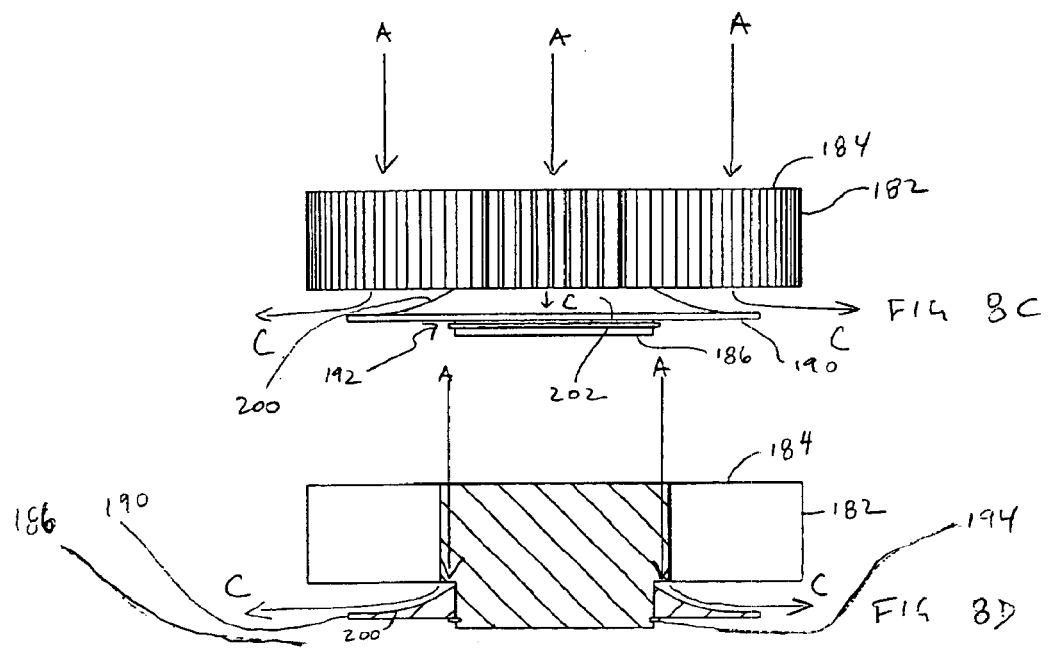
FIG 8C
FIG 8D

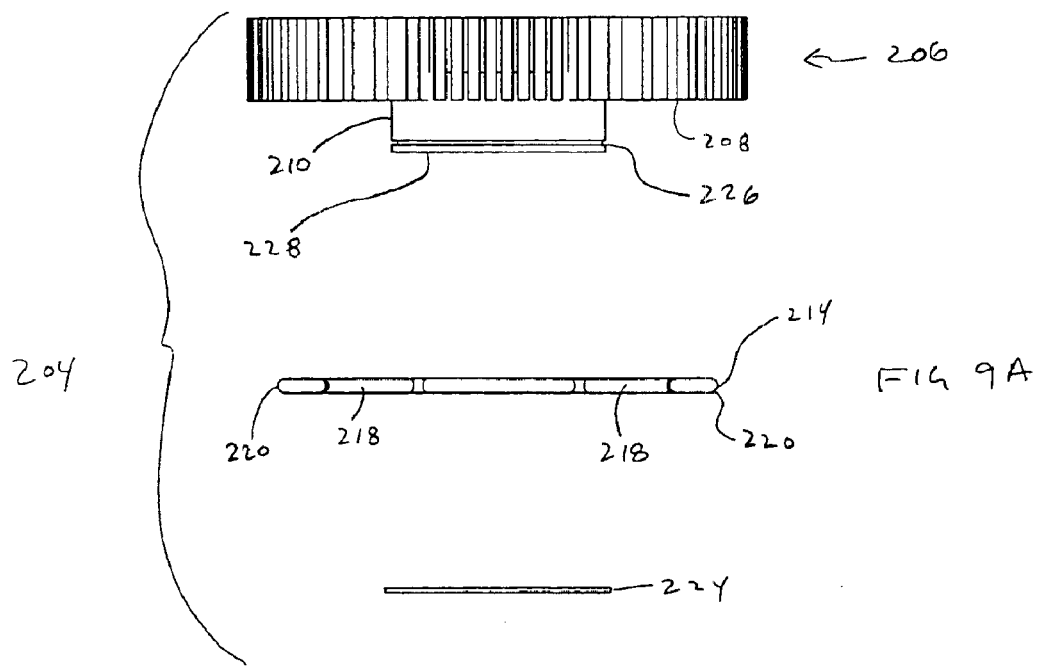
FIG 9A
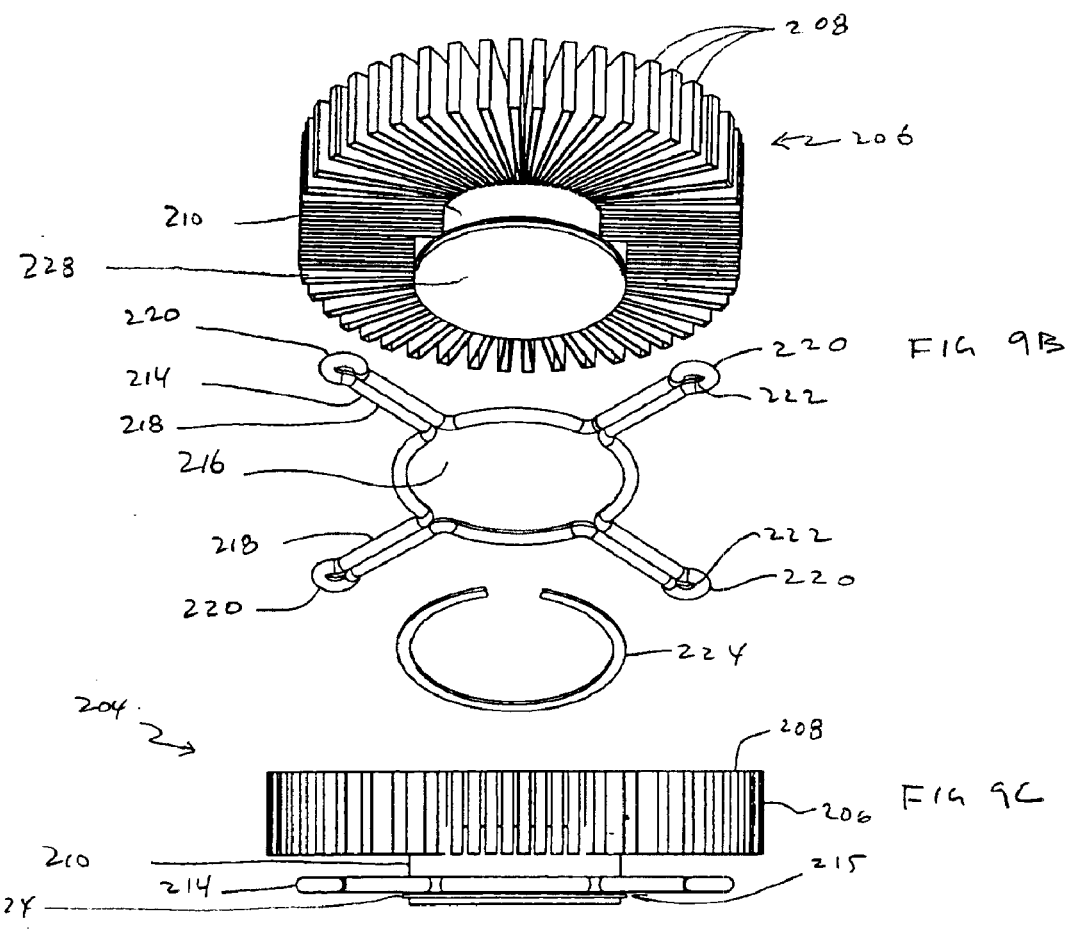
FIG 9B
FIG 9C

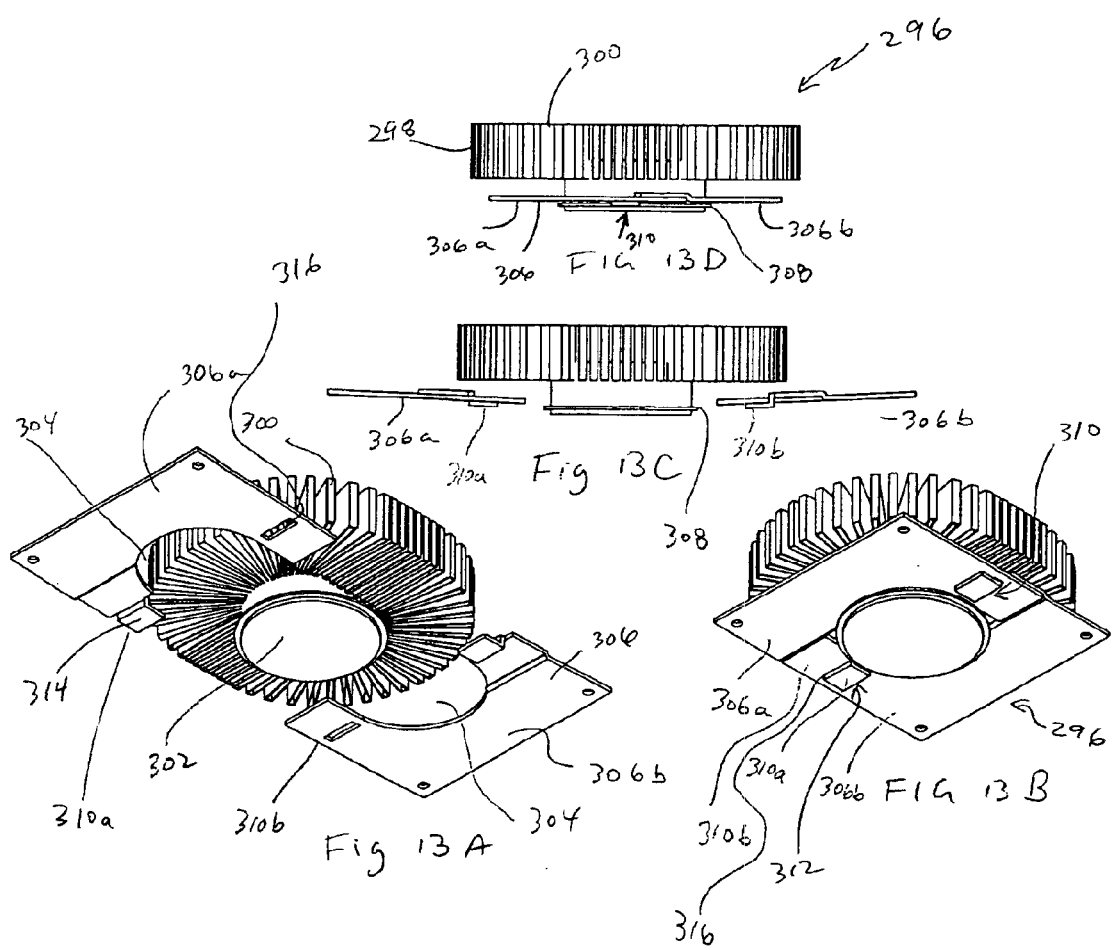

SYSTEM AND METHOD FOR MOUNTING A HEAT SINK

CROSS-REFERENCE TO RELATED APPLICATIONS

This application claims priority under 35 U.S.C. § 119(e) to provisional patent application No. 60/426,910 filed Nov. 15, 2002; the disclosure of which is incorporated herein by reference.

FIELD OF INVENTION

The invention relates generally to the field of electronic component cooling. In particular, the invention relates to a heat sink for cooling one or more electronic components.

BACKGROUND OF INVENTION

The cooling of electronics components in convection cooling applications is typically achieved using a fluid velocity source to direct a fluid about a heat sink associated with one or more electronic components. The fluid draws heat away from the heat sink, which in turn draws heat from any associated electronic component. The fluid may be a gas, such as air, which is directed by the velocity source, which may be a fan. The fan generally directs the air to flow along a predetermined path about the heat sink. The heat sink must therefore be positioned to co-operate with a particular air flow path in order to cool electronic components associated with the heat sink.

A typical installation may include a substrate upon which one or more electronic components are mounted. The substrate may then be mounted within an enclosure having air inlets and outlets to permit the removal warm air from within the enclosure. Air flow through the enclosure is encouraged by a fan. A heat sink is mounted to the substrate or the electronic components, and is used to encourage the transfer of heat generated by the electronic components to the air to be carried to the exterior of the enclosure. Pressure is preferably maintained at the interface between the heat sink and the electronic component to encourage thermal transfer therebetween. However, it can be difficult to ensure that such pressure is evenly maintained at the interface.

To promote this heat transfer, the heat sink has one or more fins to increase the surface area thereof. The fins are generally aligned so that the air flow is directed therethrough. The air flow pathway is often determined by the location of the inlets and outlets of the enclosure, and the location of the fan.

Once mounted, the orientation of the heat sink may generally not be modified without removing and re-mounting the heat sink. If securing screws for a heat sink are arranged at the vertexes of a square, then the heat sink may be removed, rotated 90 degrees, and reattached. However, the possible orientations of the heat sink is limited to four (i.e., four turns of 90 degrees each). Many arrangements of the prior art are limited in that they permit the mounting of the heat sink in one position only.

When mass produced, heat sinks are often pre-mounted to a substrate before installation within an enclosure. If the heat sink is not located within the air flow path generated by the fan, thermal-transfer from the heat sink may be sub-optimal. This arrangement may be remedied by removing and re-mounting the heat sink to align the fins of the heat sink with the flow of air generated by the fan. This remedy can increase the time and expense required to install the heat sink, and may not even be possible if suitable alternative mounting locations are not available on the substrate or electronic components. To accommodate different configurations of electronic components and fans, differently configured heat sinks are manufactured. This can increase manufacturing and inventory costs because specialized heat sinks need to be manufactured for different applications. If installations of electronic components require a non-standard orientation of the heat sink then addition effort and expense may need to be expended to fashion a solution.

The foregoing creates challenges for heat dissipation in the design and manufacture of assemblies of electronic components. Accordingly, there is a need for an alternative heat sink as compared to the existing art.

SUMMARY OF INVENTION

Electronics components heat sink in convection cooling applications rely on a fluid velocity source directing the fluid to the heat sink in a particular direction. Heat sinks and their mounting features are then designed to work with that one air direction path.

This invention provides a mounting feature that can be adapted to different heat sinks. It provides complete freedom of orientation of the heat sink, independent of the mounting location to the board.

Typically heat sinks are mounted in the orientation of the flow given by fluid movers located within the electronics enclosure. The orientation is derived by system requirements, which define the inlet and outlet air direction. This particular heat sink attachment method provides flexibility in the orientation of the heat sink within the enclosure.

The invention may define the spring clip as well as its attachment method to the heat sink. The spring clip is the part of the heat sink assembly that provides the required pressure to the chip ensuring a good thermal conduction path.

In particular, in one aspect, the invention provides a heat sink assembly comprising a heat sink and a bracket for mounting the heat sink to a component located on a circuit board. The bracket cooperates with the heat sink allowing the heat sink to be set in an installation orientation from a set of orientations relative to the bracket prior to mounting the heat sink against the component.

The heat sink may further comprise a pedestal and the bracket may further define an opening, such that the pedestal cooperates with the opening allowing the heat sink to be set in the installation orientation.

The bracket may be mountable about the component to the circuit board.

The heat sink assembly may further comprise a retaining ring cooperable with the pedestal and the bracket, such that when the pedestal is positioned through the bracket, the ring located on the pedestal in the portion extending through the bracket to retain the heat sink within the bracket.

The heat sink assembly may further comprise a housing enclosing the heat sink therein, the housing having at least one open end. Further, the housing may be rotatable about the heat sink.

In the heat sink assembly, the bracket may further comprise a bevel directing airflow towards the heat sink.

In the heat sink assembly, the bracket may comprise stamped metal. Also, the bracket may be mounted about the component to the circuit board by a fastener securing a leaf on the bracket to the circuit board. Further, the leaf may be initially biased away from the circuit board prior to being secured to the circuit board by the fastener.

In the heat sink assembly, a feature on the bracket may cooperate with a feature on the pedestal to provide the installation orientation for the heat sink. The feature on the bracket may be a key and the feature on the pedestal may be a rebate. Alternatively, the feature on the pedestal may be a key and the feature on the bracket may be a rebate.

In the heat sink assembly, a feature on the bracket may cooperate with a feature on the pedestal to inhibit rotation of the heat sink about the bracket in one direction. The feature on the pedestal may be a key and the feature on the bracket may be a raised flange.

In heat sink assembly, the bracket may comprise formed wire.

In a second aspect, a heat sink assembly is provided comprising a heat sink, a bracket and a vane connected to the bracket. The bracket is for mounting the heat sink to a component associated with a circuit board. The vane directs air flow from the bracket to the heat sink. The bracket permits the heat sink to be set in a position relative to the bracket prior to final mounting of the heat sink to the circuit board.

Other combinations, subset and variations of the above described aspects are also provided by other aspects of the invention. Other aspects the invention are described below.

BRIEF DESCRIPTION OF DRAWINGS

For the purposes of description, but not of limitation, the foregoing and other aspects of the invention are explained in greater detail with reference to the accompanying drawings, in which:

FIG. 1 is an exploded perspective view of a heat sink assembly for mounting to a substrate in accordance with an embodiment of the invention;

FIG. 8A is an exploded perspective view of a heat sink assembly according to an embodiment of the invention;

FIG. 8B is an exploded side view of the heat sink assembly of FIG. 8A;

FIG. 8C is an assembled side view of the heat sink assembly of FIG. 8A;

FIG. 8D is a cross-section view of the heat sink assembly of FIG. 8C;

FIG. 9A is an exploded side view of a heat sink assembly according to an embodiment of the invention;

FIG. 9B is an exploded perspective view of the heat sink assembly of FIG. 9A;

FIG. 9C is an assembled side view of the heat sink assembly of FIG. 9A;

FIG. 13A is an exploded perspective view of a heat sink assembly according to an embodiment of the invention;

FIG. 13B is an assembled perspective view of the heat sink assembly of FIG. 13A;

FIG. 13C is an exploded side view of a heat sink assembly according to an embodiment of the invention; and FIG. 13D is an assembled side view of the heat sink assembly of FIG. 13C.

DETAILED DESCRIPTION OF EMBODIMENTS

Figure 2A:
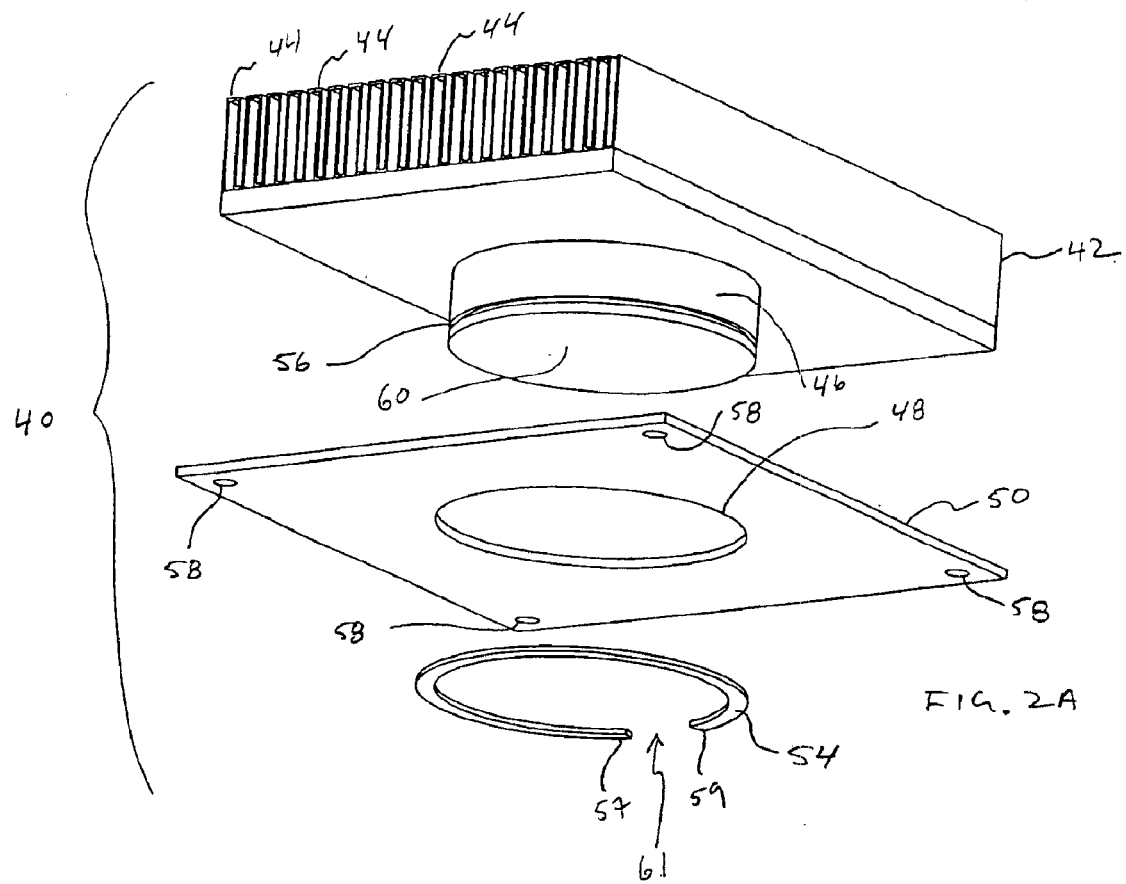
FIG. 2A is an exploded view of a heat sink assembly according to an embodiment of the invention.

The description which follows, and the embodiments described therein, are provided by way of illustration of an example, or examples, of particular embodiments of the principles of the present invention. These examples are provided for the purposes of explanation, and not limitation, of those principles and of the invention. In the description which follows, like parts are marked throughout the specification and the drawings with the same respective reference numerals.

Referring to FIG. 1, a heat sink assembly 20 is shown according to an embodiment of the invention is shown. Heat sink assembly 20 may be mounted to a substrate 22, such as a motherboard, so that it cools an electronic component such as an integrated circuit chip 24. Heat sink assembly 20 includes a heat sink, which may have any of a number of configurations that are well known in the art. In this particular embodiment, heat sink 26 is generally rectangular and has spaced, generally parallel, fins 28. Heat sink 26 is connected to a heat sink mounting plate 30. Mounting plate 30 is secured to substrate 22 (or a component thereof) using fasteners 32. Fasteners 32 are inserted through one or more holes 34, defined in mounting plate 30. Fasteners 32 are retained in bores 36 located in substrate 22. Fasteners 32 may be screws, and bores 36 may be threaded bores. Heat sink 26 may be located within an enclosure 38. Fins 28 are oriented to allow a fluid, such as air, to travel along fins 28 in the enclosure 38 in direction A, thereby allowing for improved air contact with fins 28. Air is circulated about heat sink 26 by a fluid circulating means, such as a fan 37. Fan 37 can be operated to impel or propel air as design requirements dictate. Air is introduced to enclosure 38 at an air inlet in a direction such as direction A, and air exits enclosure 38 at an outlet in a direction such as direction B. The combined heat sink assembly 20 and substrate 22 may alternatively be located together within an enclosure having at least one inlet through which air is permitted to circulate. Cooling may also be achieved without the use of an enclosure or similar structure if there is sufficient air flow about heat sink 26 to cool it. Circulation of the air may be encouraged by an apparatus or structure such as a fan, or in some other manner.

Figure 2B:
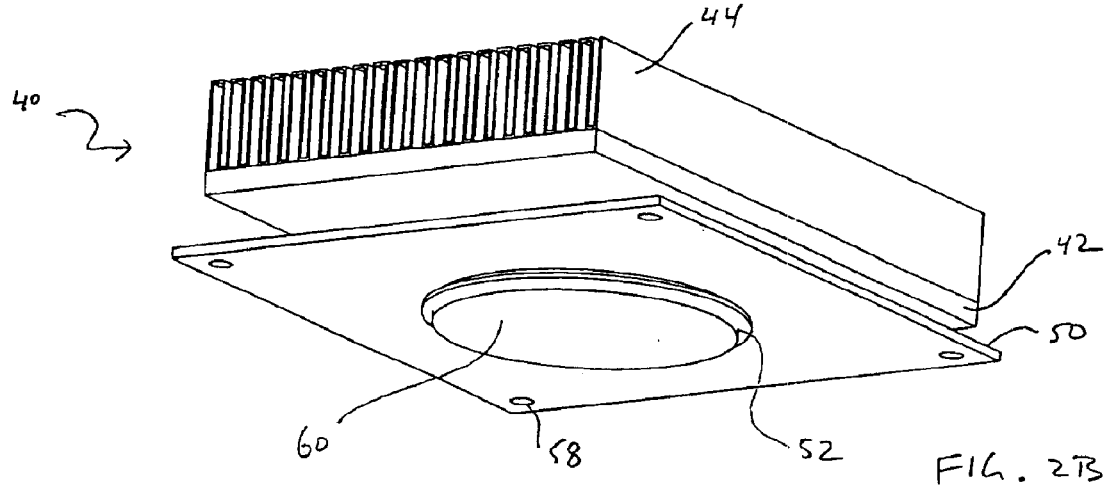
FIG. 2B is an assembled perspective view of the heat sink assembly of FIG. 2A.
Figure 2C:
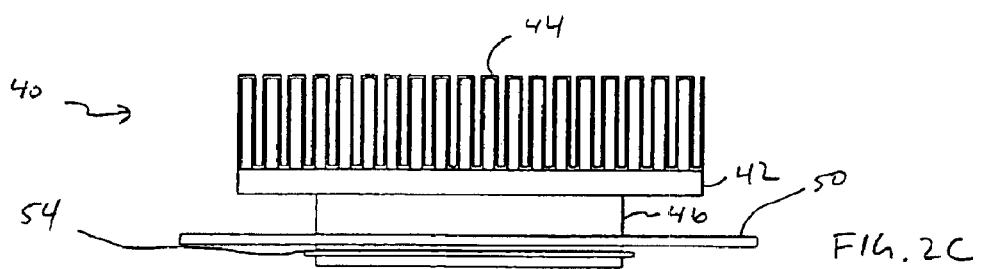
FIG. 2C is an assembled side view of the heat sink assembly of FIG. 2A
Figure 3A:
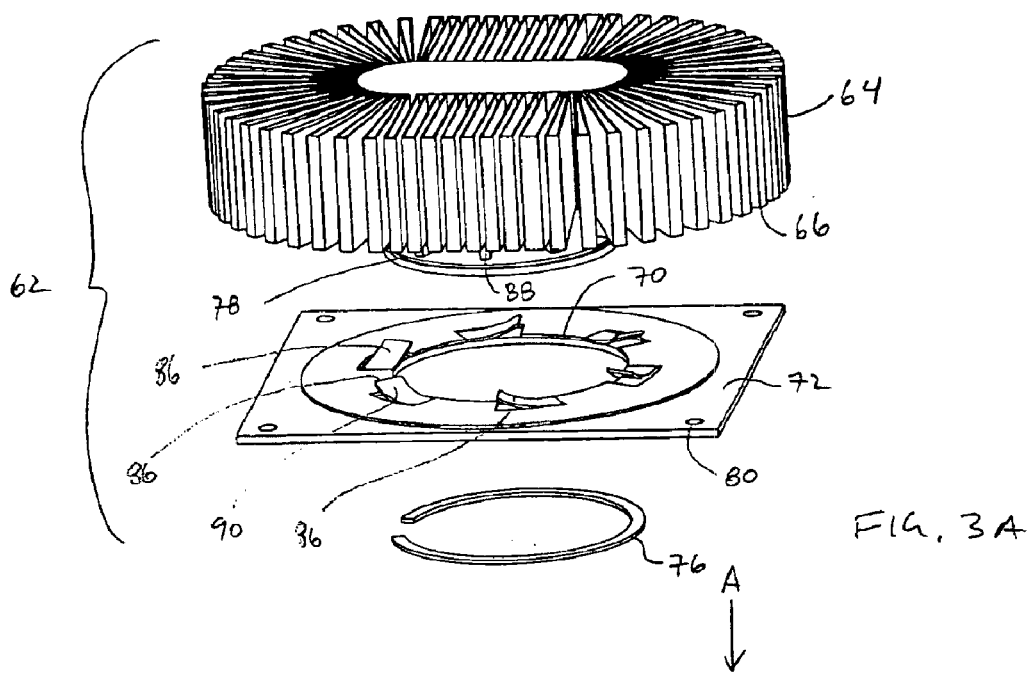
FIG. 3A is an exploded view of an embodiment of the heat sink assembly having a ratchet mechanism.
Figure 3B:
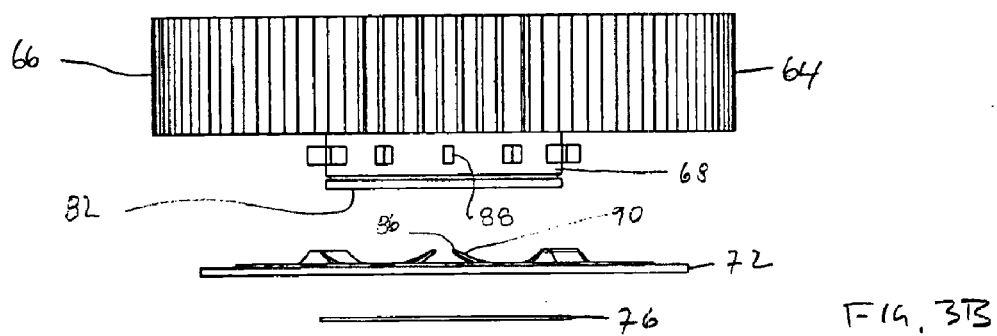
FIG. 3B is a side exploded view of the heat sink assembly of FIG. 3A.

Referring to FIGS. 2A to 2C, an embodiment of the heat sink assembly is shown as 40. Heat sink assembly 40 includes a heat sink 42 having a plurality of fins 44. Fins 44 are shown as being aligned in side-by-side relationship and are generally spaced parallel to one another. Fins 44 may be arranged in other orientations known in the art, such as those described for the other embodiments (see, for example FIG. 3A or FIG. 9B). On a side of heat sink 42 generally opposite to fins 44, a projection in the nature of a base, slug, or pedestal 46 is connected to heat sink 42. Pedestal 46 may be any regular shape but is preferably generally cylindrical, as shown in FIG. 2A.

Pedestal 46 is inserted through an opening 48 in mounting plate 50 of heat sink assembly 40. Opening 48 is preferably the same size and shape as a lateral cross-section of pedestal 46 to allow relatively easy rotation of heat sink 42 within opening 48. Pedestal 46 is retained within opening 48 by a retaining assembly 52. Retaining assembly 52 includes a retainer in the nature of a clip or spring clip 54 and a corresponding feature such as groove 56. Clip 54 is retained by groove 56, which is located about the circumference of pedestal 46.

Clip 54 is preferably penannular, having free ends 57 and 59 spaced by a gap 61. Gap 61 is smaller than the diameter of pedestal 46 so that clip 54 may be retained thereon. To attach clip 54 within groove 56, free ends 57 and 59 are moved apart to create a gap sufficient to permit passage of pedestal 46 therethrough. Once pedestal 46 is placed within clip 54, clip 54 is aligned with groove 56, and free ends 57 and 59 are moved, or permitted to resiliently return, to their initial position. Groove 56 may be a partial or circumferential groove, as long as it extends sufficiently to effectively retain clip 54. While the present embodiment is illustrated using a clip and groove arrangement to retain pedestal 46, any other retaining mechanism known in the art may be used to retain pedestal 46. In the present configuration, heat sink 42 is rotatably moveable about the axis of pedestal 46 and is retained to mounting plate 50 by retaining assembly 52.

If pedestal 46 is generally cylindrical, it may be freely rotated within opening 48. However, if pedestal 46 has a cross-section that is some other regular polygonal shape, such as a regular pentagon, square or other shape, and opening 48 is configured accordingly, pedestal 46 may only be positioned by removing it from opening 48, then rotating it, and reinserting it into opening 48. This manipulation permits the orientation of heat sink 42 to be changed relative to mounting plate 50, as is possible when pedestal 46 has a generally round cross-section.

Prior to an attachment to substrate 22, mounting plate 50 is positioned relative to substrate 22 so that holes 58 are aligned with corresponding bores 36. This permits heat sink assembly 40 to be mounted to substrate 22 using fasteners 32. Since mounting plate 50 is rotatable relative to heat sink 42, bores 36 may be located anywhere that is convenient, without affecting the orientation of heat sink 42. Bores 36 do not need to be located at the vertexes of a virtual square (not shown) which is aligned and centred about chip 24. Bores 36 may have some other relationship to the location of chip 24 so long as holes 58 in mounting plate 50 are configured to align therewith, and sufficient force can be exerted on a free end of pedestal 46 (as described in greater detail below).

Once holes 58 and bores 36 are aligned, fasteners 32 may be partially threaded therethrough, but not tightened. At this stage of assembly, heat sink 42 may be rotated relative to mounting plate 50. This rotation permits fins 44 to be aligned with an airflow A to assist cooling of heat sink 42, and, ultimately, cooling of chip 24. Heat sink assembly 40 thus permits heat sink 42 to be readily oriented to co-operate with airflow A. Accordingly, the configuration of substrate 22 and any electronic components such as chip 24 is not constrained by the location of the source of air flow A (such as a fan), nor by the direction of air flow A, because heat sink 42 may be conveniently aligned therewith during mounting of heat sink assembly 40 to substrate 22 (or a component thereof).

Once heat sink 42 is oriented, fasteners 32 may be tightened in bores 36. This tightening brings a thermal transfer interface 60 of pedestal 46 into contact with a surface of chip 24. Thermal transfer interface 60 may be located at the distal end of pedestal 46. This physical connection between pedestal 46 and chip 24 permits heat generated by chip 24 to be conducted by pedestal 46 into heat sink 42 and dissipated into air flow A by fins 44.

The force exerted by thermal transfer interface. 60 on chip 24 may be increased by locating the openings 65 of bores 36 in a plane that is closer to substrate 22 than the plane of the surface of chip 24 that contacts thermal transfer interface 60. In this configuration, thermal transfer interface 60 is brought into contact with the surface of chip 24, and fasteners 32 are inserted through holes 58 and into bores 36. Before fasteners 32 are tightened, there is a gap between mounting plate 50 and the openings 65 of bores 36. As fasteners 32 are tightened within bores 36, portions of mounting plate 50 adjacent holes 58 are deflected toward the bores 36. This deflection causes plate 50 to act as a spring to bias pedestal 46 against chip. 24, increasing the pressure applied thereto. An increase in pressure at the interface between pedestal 46 and chip 24 provides improved contact between heat conducting surfaces of chip 24 to pedestal 46. The degree to which pedestal 46 is biased towards chip 24 may vary depending on the requirements and characteristics of chip 24 and heat sink 42. Maintaining pressure at the interface between pedestal 46 and chip 24 also keeps heat sink 42 in thermal contact with chip 24 during moving and vibration thereof. This arrangement also maintains generally even pressure at the interface between pedestal 46 and chip 24.

Plate 50 is preferably made from a metal, but it may be made from any of a number of appropriate materials. For example, it may be made from steel, beryllium, copper, aluminum (e.g., 2024 or 7075) or some other metal or composite having a high modulus elasticity and high yield strength.

As discussed above, heat sink assembly 40 is adaptable to many different configurations of substrate assembly 22, and different air flow pathways, by rotating heat sink 42 relative to mounting plate 50 to obtain an advantageous orientation of mounting plate 50 and heat sink 42.

Referring to FIGS. 3A to 3D, an embodiment of the heat sink assembly is shown generally as 62. Heat sink assembly 62 is similar to heat sink assembly 40 and functions in a similar manner, except as indicated below. Heat sink assembly 62 includes a heat sink 64 having fins 66. Fins 66 are arranged in a generally circular oblong arrangement having spaces therebetween. Fins 66 are generally parallel to one another, but are oriented in a direction generally perpendicular to the orientation of fins 44. This configuration permits cooling of heat sink 64 when the air flow is from a direction generally perpendicular to that of the example described for heat sink assembly 40. It should be noted that the particular configuration of the fins of any heat sink described herein for any of the various embodiments, is not essential. The fins need only be configured as appropriate for a particular installation having a given air flow.

Heat sink 64 includes a pedestal 68 for insertion through an opening 70 of mounting plate 72. A retaining assembly 74 maintains pedestal 68 within opening 70. Retaining assembly 74 includes a retainer which may be in the nature of a clip 76. Clip 76 is in turn retained by a corresponding groove 78 about pedestal 68, which groove may be a circumferential groove. Holes 80 located in plate 72 receive fasteners 32 that are inserted into bores 36 to retain heat sink assembly 62 to substrate 22. Thermal transfer interface 82 is brought into abutting relationship with chip 24, and a force is applied by thermal transfer interface 82 upon chip 24 by the tightening of fasteners 32.

Heat sink assembly 62 additionally includes a ratchet 84. Ratchet 84 includes one or more unidirectional keys, or stops 86, that co-operate with one or more raised flange, or tooth 88. Unidirectional stops 86 may be attached to or formed in mounting plate 72. Teeth 88 are flanges which are attached at one end to pedestal 60 and are raised at a free end from pedestal 60. Teeth 88 are located about pedestal 60 (alternatively teeth 88 could be located about opening 70). Teeth 88 co-operate with unidirectional stops 86 to permit rotation of heat sink 64 about the axis of pedestal 68 in one direction. Prior to the tightening of fasteners 32, heat sink 64 may be past a predetermined number of the unidirectional stops 86. Stops 86 thus provide an indication of rotation of heat sink 64 through a given arc. A greater or lesser number of stops may be spaced evenly about opening 70 to indicate degrees of rotation of heat sink 64. This arrangement may help to more precisely align heat sink 64 with a given air flow. For example, written instructions to a technician for mounting heat sink assembly 62 to substrate 22 may indicate that heat sink 64 should be rotated past three unidirectional stops 86 prior to tightening of fasteners 32.

In operation, as heat sink 64 is rotated within opening 70, teeth 88 come into contact with sloped sides 90 of unidirectional stops 86. Unidirectional stops 86 are preferably made of a resilient material that permits stops 86 to deflect toward plate 72 as teeth 88 are forced along slope side 90. As teeth 88 clear slope side 90, resilient unidirectional stops 86 return to their original positions. In this position, stops 88 abut a side of teeth 88 to inhibit rotation of heat sink 64 in an opposite direction.

Figure 3C:
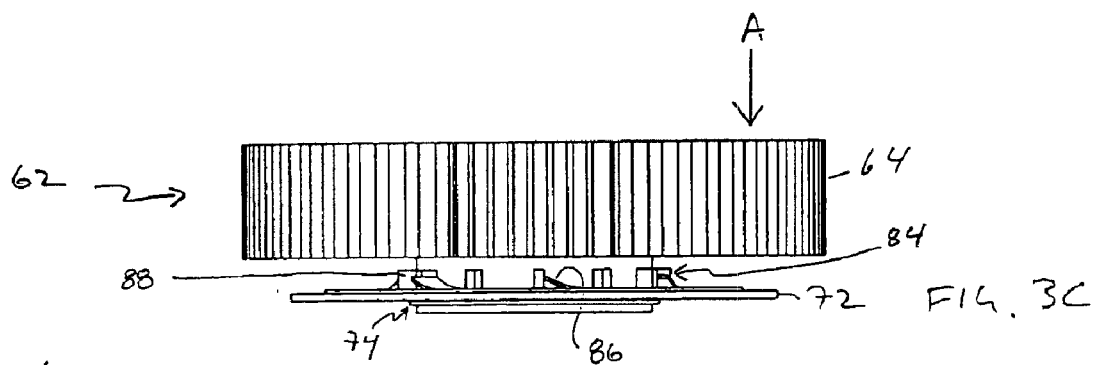
FIG. 3C is an assembled side view of the heat sink assembly of FIG. 3A.
Figure 3D:
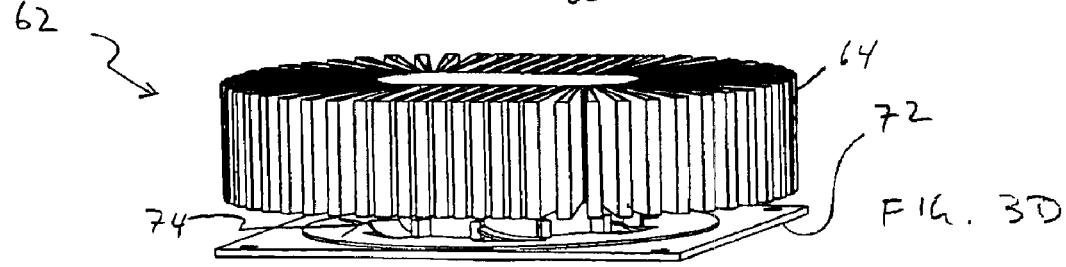
FIG. 3D is an assembled perspective view of the heat sink assembly of FIG. 3A.

It will be appreciated that the number of teeth 88 does not need to correspond with the number of unidirectional stops 86, as illustrated in FIG. 3C, for example. A greater number of teeth 88 than stops 86 provides an indication of rotation through smaller increments than there are stops 86. The relative spacing of teeth 88 and stops 86 need not be uniform. Different spacings can provide various indications of the degree of rotation of heat sink 64.

Since heat sink 64 is non-circular, rotation thereof changes the effect an airflow A has on the heat transfer characteristics of heat sink 64. For example, in FIG. 3C, rotation of heat sink 64 through an arc of 90 degrees takes heat sink 64 substantially out of the path of air flow A. Accordingly, the effect of air flow A on heat sink 64 may be varied by rotating heat sink 64 through different arcs.

Figure 4A:
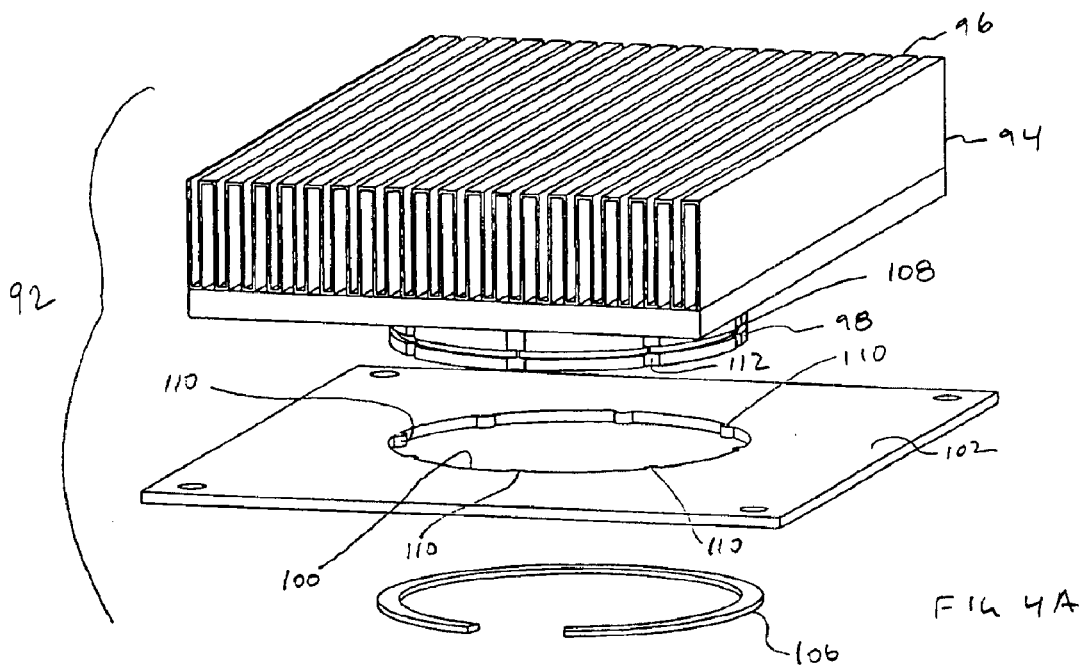
FIG. 4A is an exploded perspective view of a heat sink assembly according to an embodiment of the invention.
Figure 4B:
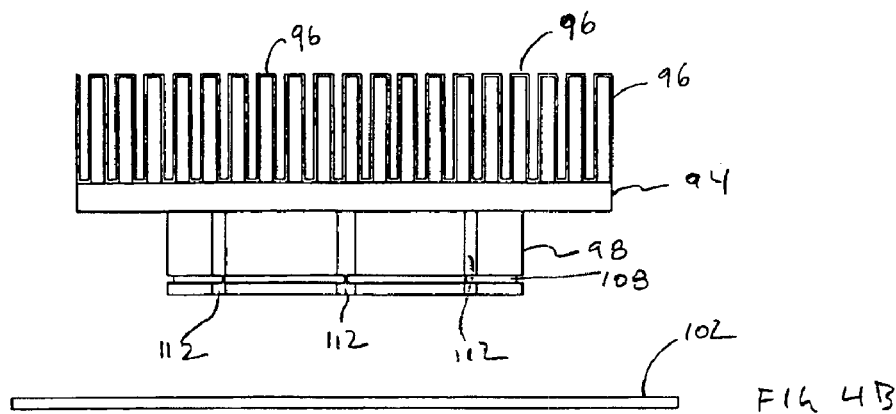
FIG. 4B is an exploded side view of the heat sink assembly of FIG. 4A.
Figure 4C:
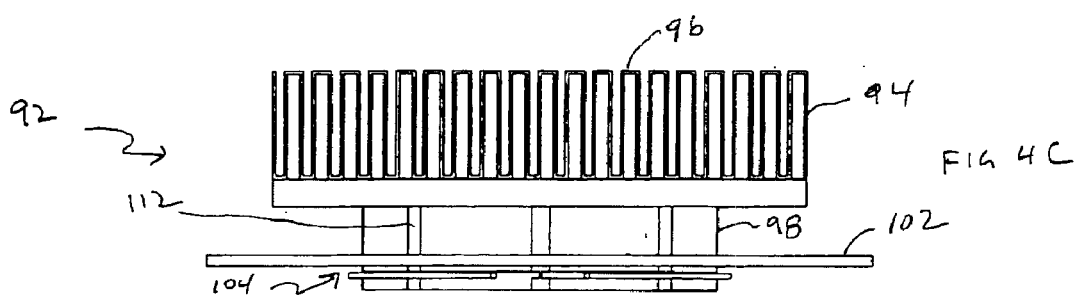
FIG. 4C is an assembled side view of the heat sink assembly of FIG. 4A.

Referring to FIGS. 4A to 4C, a further embodiment of a heat sink assembly is shown generally as 92. Heat sink assembly 92 operates in generally the same manner as described for heat sink assembly 62 and heat sink assembly 40, except as described below. Heat sink assembly 92 includes a heat sink 94 having fins 96 and a pedestal 98. Pedestal 98 is inserted through opening 100 which is located in mounting plate 102. Pedestal 98 is retained within opening 100 by a retaining assembly 104, which includes a retainer in the nature of a clip 106. Clip 106 is located within a groove 108 of pedestal 98.

Heat sink assembly 92 differs from the other embodiments described herein, in that it has one or more protrusions 110 in the nature of nibs or keys located at an edge of opening 100. Keys 110 may be evenly spaced from each other. Pedestal 98 has one or more rebates 112 running transverse to groove 108 and generally parallel to a central axis of pedestal 98. Rebates 112 are sized and located to correspond with the size and location of keys 110. When pedestal 98 is inserted into opening 100, keys 110 are aligned with rebates 112 to permit passage of pedestal 98. In this position, rotation of heat sink 94 is inhibited by keys 110. However, heat sink 94 may be oriented relative to mounting plate 102 prior to insertion of pedestal 98 into opening 100. This permits heat sink 94 to be oriented relative to airflow A as described for earlier embodiments. Unlike the previously described embodiments, once pedestal 98 is inserted into opening 100, further rotation of heat sink 94 is inhibited. This arrangement permits greater securement of heat sink 94. Once inserted through opening 100, pedestal 98 is secured with clip 106. Heat sink assembly 92 otherwise operates in a similar manner as described for the previous embodiments.

In another embodiment, keys (as described earlier) may be located on a mounting plate and rebates (as described earlier) may be located on a pedestal of a heat sink. The pedestal of the heat sink and the mounting plate cooperate in a similar manner to provide a set of orientations as described above. Also, rather than having keys 110, pedestal 98 could instead be configured to have a cross-section of any regular shape other than a circle, such as an equilateral triangle (not shown). Opening 100 would be configured to have substantially the same shape so that it could receive the pedestal. Since a non-circular cross-section is used, rotation of the pedestal within opening 100 would be inhibited. In a similar manner as the embodiment described above, the pedestal (and heat sink) could be rotated to a desired orientation before inserting the pedestal to the opening. Once inserted, rotation of the pedestal would be impeded.

Figure 5A:
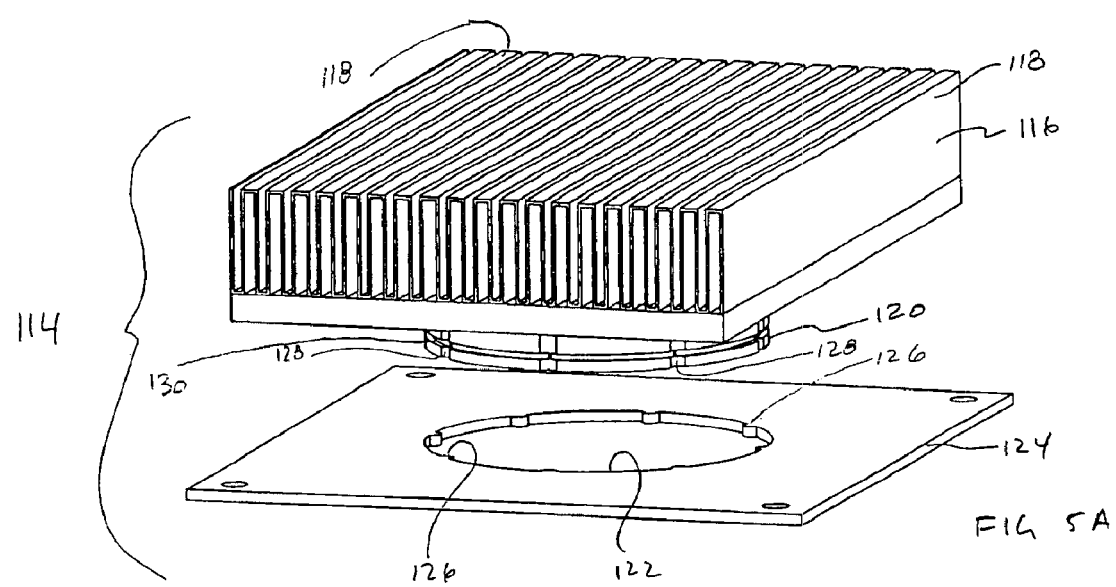
FIG. 5A is an exploded perspective view of a heat sink assembly according to an embodiment of the invention.
Figure 5B:
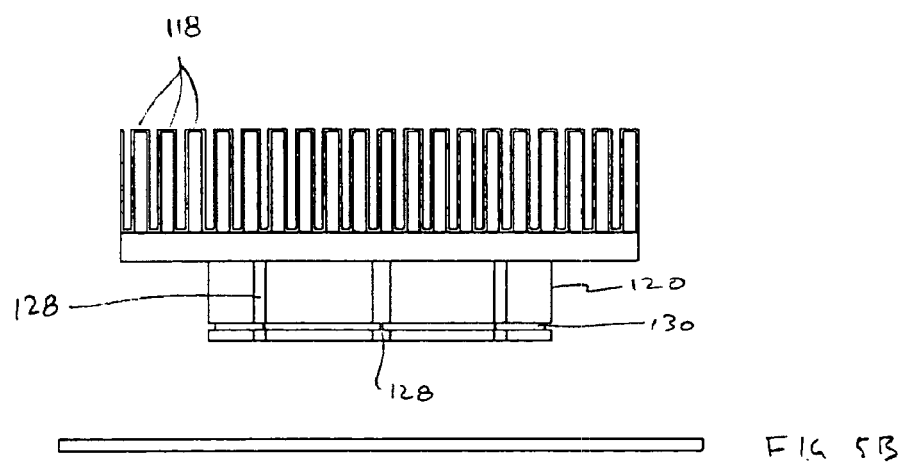
FIG. 5B is an exploded side view of the heat sink assembly of FIG. 5A.
Figure 5C:
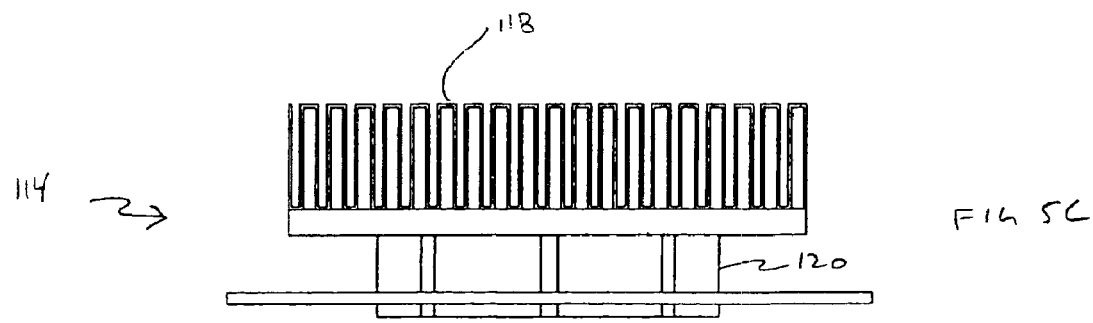
FIG. 5C is an assembled side view of the heat sink assembly of FIG. 5A.

Referring to FIGS. 5A to 5C, an embodiment of a heat sink assembly is shown generally as 114. Heat sink assembly 114 is similar to the other embodiments described in that it includes a heat sink 116 having fins 118 and a pedestal 120. Pedestal 120 may be inserted through opening 122, which is located in mounting plate 124. Opening 122 has protrusions in the nature of keys 126, which are received by transverse rebates 128 located along pedestal 120.

Heat sink assembly 114 differs from the other embodiments described in that it does not include a retaining assembly as described, for example, for heat sink assembly 92. Instead, pedestal 120 is inserted into opening 122 by aligning keys 126 with transverse rebates 128. When keys 126 are aligned with a retainer in the nature of a groove 130, heat sink 116 is rotated about the axis of pedestal 120. Groove 130 is preferably circumferential and is configured to receive keys 126. Once keys 126 enter groove 130, movement of heat sink 116 in a direction perpendicular to the plain of mounting plate 124 is inhibited. Once keys 126 are located in rebates 128, mounting plate 124 may be fastened to substrate 22 in the manner described above. As fasteners 32 are tightened, mounting plate 124, and in particular keys 126, bear against a surface of groove 130 to inhibit further rotational movement of heat sink 116.

Heat sink 116 may be rotated to a preferred orientation prior to the fastening of mounting plate 124 to substrate 22. However, if heat sink 116 is rotated through an arc that corresponds to the distance between keys 126, then keys 126 will realign with transverse rebates 128, and heat sink 116 will no longer be retained to mounting plate 124. Accordingly, the spacing of keys 126 and rebates 128, and the number of keys 126 and rebates 128, may be varied to permit rotation of heat sink 116 through different arcs of rotation.

Figure 6A:
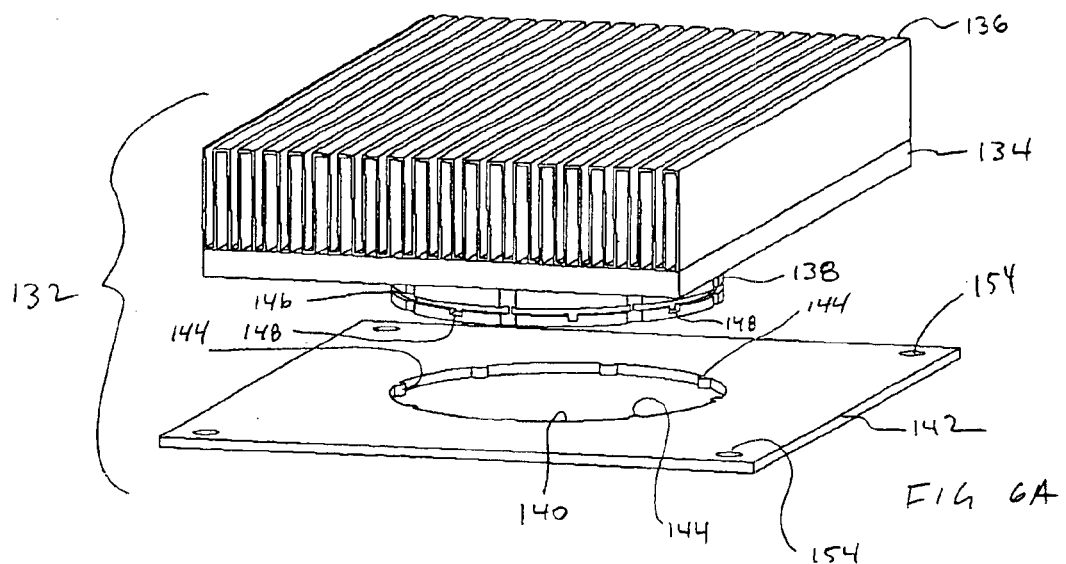
FIG. 6A is an exploded perspective view of a heat sink assembly according to an embodiment of the invention.
Figure 6B:
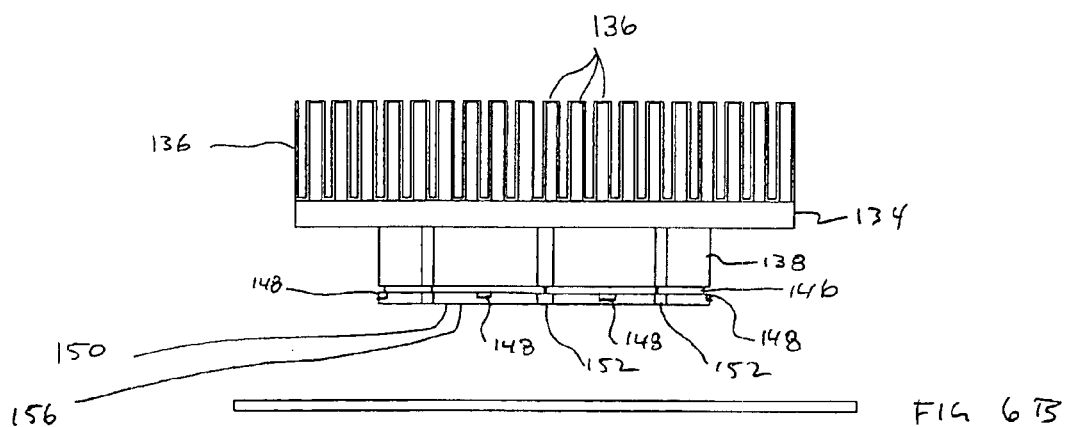
FIG. 6B is an exploded side view of the heat sink assembly of FIG. 6A.
Figure 6C:
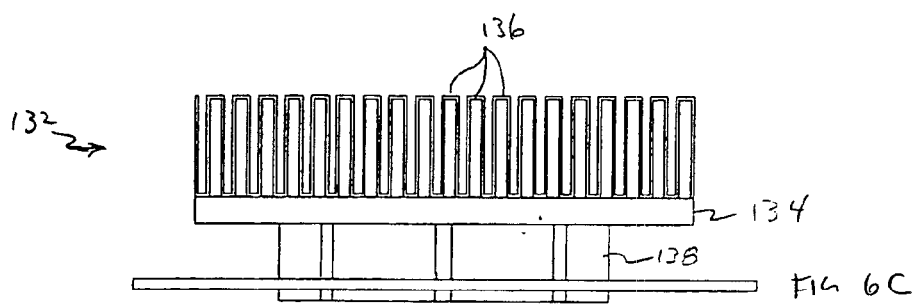
FIG. 6C is an assembled side view of the heat sink assembly of FIG. 6A.

Referring to FIGS. 6A to 6C, an embodiment of the heat sink assembly is shown generally as 132. Heat sink assembly 132 is most similar to heat sink assembly 114, described above. In particular, heat sink assembly 132 includes a heat sink 134, having fins 136 and a pedestal 138 mounted thereto. Pedestal 138 may be inserted through an opening 140 in a mounting plate 142. Movement of pedestal 138 relative to mounting plate 142 is inhibited in a direction transverse to the plain of mounting plate 142 by rotating pedestal 138 about its axis to cause keys 144 to enter groove 146.

Heat sink assembly 132 differs from heat sink assembly 114 in that one or more steps 148 are located along groove 146. Steps 148 are circumferentially located about pedestal 138 and are spaced to correspond to the spacing of keys 144. Steps 148 are preferably located in a side of groove of 146 that is adjacent to a free end 150 of pedestal 138.

To mount heat sink assembly 132, heat sink 134 is rotated to an orientation that aligns keys 144 with transverse rebates 152. As pedestal 138 is inserted into opening 140, keys 144 move along transverse rebates 152 until they encounter groove 146. At this point heat sink 116 is rotated towards a desired orientation (alternatively, or in conjunction, mounting plate 142 is rotated to a desired orientation), and keys 144 enter groove 146. Further insertion or removal of pedestal 138 into opening 140 is thereby inhibited. As heat sink 134 is rotated, keys 144 become positioned adjacent steps 148.

Next, fasteners 32 are inserted and tightened in holes 154. As fasteners 32 are tightened, plate 142 is drawn towards substrate 22. At the same time, thermal transfer interface 156 bears against a surface of chip 24 so that its displacement towards substrate 22, if any, is less than that of plate 142. This causes keys 144 to enter steps 148 as mounting plate 142 is deflected towards substrate 22. Once fasteners 32 are tightened, further rotational movement of pedestal 138 (and therefore heat sink 134) is inhibited by keys 144, which are retained within step 148.

Figure 7A:
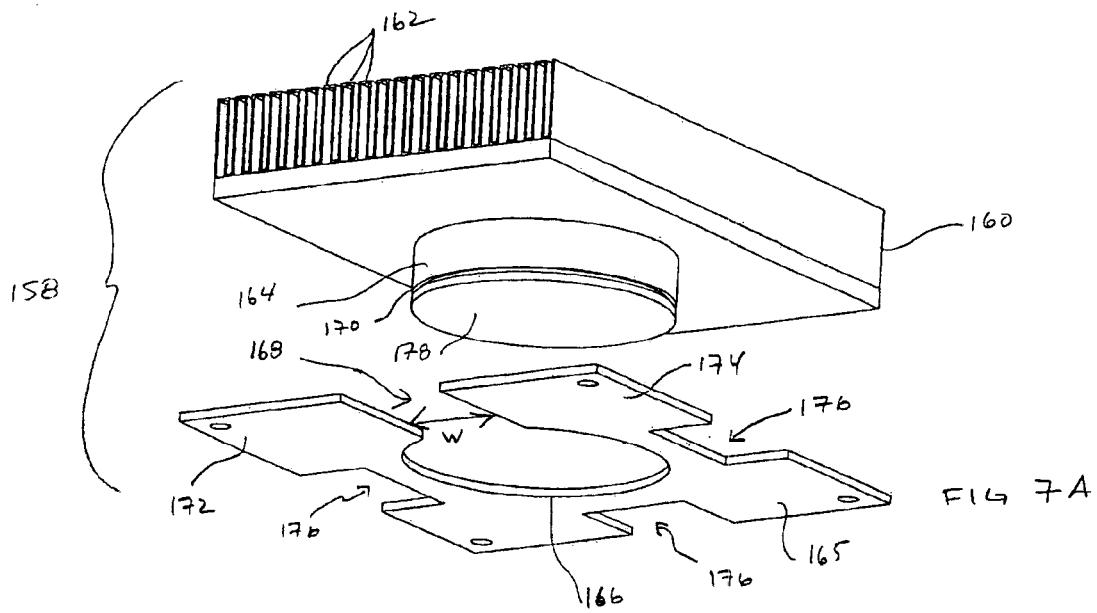
FIG. 7A is an exploded perspective view of a heat sink assembly according to an embodiment of the invention.
Figure 7B:
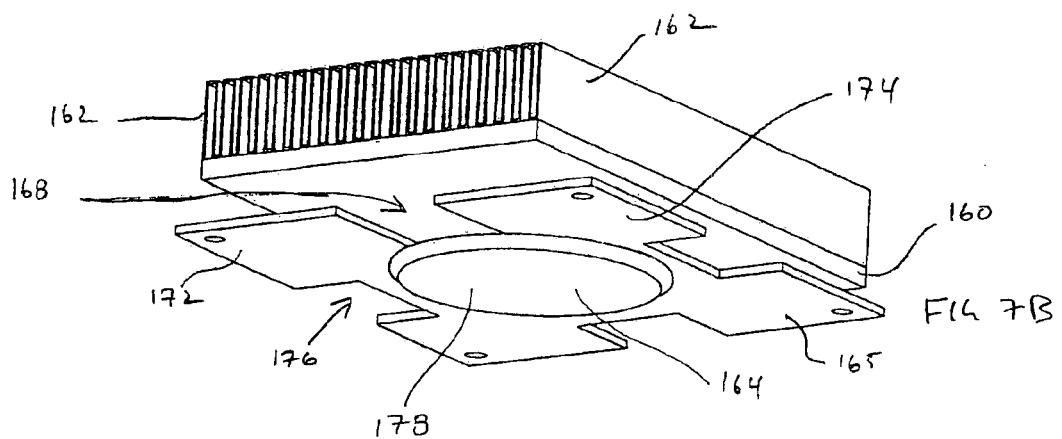
FIG. 7B is an assembled perspective view of the heat sink assembly of FIG. 7A.
Figure 7C:
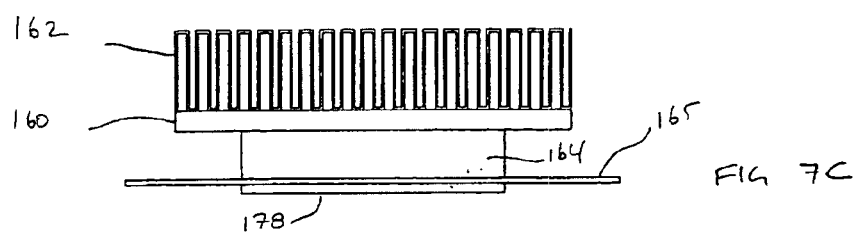
FIG. 7C is an assembled side view of the heat sink assembly of FIG. 7A.

Referring to FIGS. 7A to 7C, an embodiment of the heat sink assembly is shown generally as 158. Heat sink assembly 158 includes heat sink 160 having fins 162, and a pedestal 164 depending therefrom. Mounting plate 165 differs in configuration from the mounting plates described above. In particular, opening 166 of mounting plate 165 does not permit passage of pedestal 164 in the manner described above. Instead, mounting plate 165 has a passage 168 defined therein located between an edge of mounting plate 165 and opening 166. Passage 168 permits pedestal 164 to be laterally introduced into opening 166, as described below. To inhibit lateral removal of pedestal 164 from opening 166, the width W of passage 168 is less than a diameter of pedestal 164. The size and shape of opening 166 is configured to be generally the same as the void defined by groove 170.

To introduce pedestal 164 into opening 166, free ends 172 and 174 of mounting plate 165 are deflected in opposite directions out of the plane of mounting plate 165. This has the effect of increasing the size of passage 168 to permit pedestal 164 to pass therethrough. Opening 166 is then aligned with groove 170 so that the portions of mounting plate 165 defining opening 166 enter into, and are retained by, groove 170. At the same time, free ends 172 and 174 are returned (or are permitted to resiliently return, if materials allow) to their initial location in the same plane as mounting plate 165. Mounting plate 165 is preferably made of a resilient and flexible material so that free ends 172 and 174 return to their initial positions when a force is no longer applied to them.

One or more cutaways 176 may be made in mounting plate 165 to increase the flexibility thereof, and to permit increased airflow about heat sink 160 and chip 24. Mounting plate 165 is secured to substrate 22 in a manner similar to that described above. This causes mounting plate 165 to act as a spring and bear against pedestal 164 about groove 170 so that thermal transfer interface 178 bears against a surface of chip 24, and further rotation of heat sink 160 is inhibited.

Referring to FIGS. 8A to 8D, an embodiment of a heat sink assembly is shown generally as 180. Heat sink assembly 180 is similar to heat sink assembly 40, but shares many of the characteristics and functionality described for the other embodiments as well. Heat sink assembly 180 includes a heat sink 182 having fins 184 on one side thereof, and a pedestal 186 projecting from another side thereof. Pedestal 186 may be inserted into an opening 188 of a mounting plate 190. Removal of pedestal 186 from opening 188 is inhibited by a retaining assembly 192, which may include a retainer in the nature of a clip 194. Clip 194 co-operates with a corresponding groove 196 located about pedestal 186. As for the other embodiments, fasteners 32 may be inserted through holes 198 to secure heat sink assembly 180 to a substrate 22.

In the present embodiment, mounting plate 190 differs from those previously described. Mounting plate 190 has a bevel or vane portion 200, which may be added to or integral with mounting plate 190. Vane 200 is preferably integral with mounting plate 190. Vane portion 200 is bevelled having a generally frustoconical shape, and defines an opening 188 at an end 189 thereof. Sides 202 of vane 200 are generally arcuate and taper from opening 188 to gradually merge with mounting plate 190.

In operation, air flow is directed to heat sink assembly 180 in direction A (see FIGS. 8C and 8D). Air is drawn through fins 184 and encounters vane 200. Arcuate sides 202 of vane 200 direct air which has been heated by its passage through fins 184, away from heat sink assembly 180 in air flow direction C. This configuration reduces the pressure drop required to pass the air through heat sink assembly 180 in order to encourage re-direction of air flow across mounting plate 190 and laterally away from heat sink 182.

The shape of vane 200 is not limited to the shape illustrated in FIGS. 8A to 8D. Any other shape may be used to encourage the flow of air in a desired direction in order to improve cooling of heat sink 182 and any associated electronic components. For example, vane portion 200 could have spiral grooves, it could be cup shaped, it could have generally straight sides, or it could have concave sides. Vane 200 may also have some irregular shape which may be used to direct airflow to a particular portion or portions of an enclosure that houses substrate 22 and heat sink assembly 180.

As shown in the cross section of FIG. 8D, vane portion 200 is formed by a thicker section in mounting plate 190 about opening 188. Vane 200 may be formed in some other manner, such as stamping or pressing it from plate 190, injection moulding or casting plate 190, or in some other manner.

Referring to FIGS. 9A to 9C, an embodiment of a heat sink assembly is shown generally as 204. Heat sink assembly 204 is generally similar to heat sink assembly 40, but shares many of the features and advantages of the other embodiments described. In particular, heat sink assembly 204 includes a heat sink 206 having fins 208 and a pedestal 210. Heat sink assembly 204 differs from the other embodiments in that the mounting assembly is in the nature of a wire frame 214.

Wire frame 214 may be formed from a single piece of wire, or some other appropriate material. Alternatively, it may be formed in sections which are inserted, welded or otherwise connected to one another.

Wire frame 214 defines an opening 216 which is similar in function to opening 48 of heat sink assembly 40. Wire frame 214 has two or more arms 218, having arcuate free ends 220 defining holes 222. Holes 222 function in a similar manner to holes 58, and receive fasteners 32 for securing heat sink assembly 204 to substrate 22. When fasteners 32 are secured to substrate 22, arms 218 are caused to flex and bear down on an installed clip 224 of retaining assembly 215, which is retained within a groove 226. This causes thermal transfer interface 228 to exert pressure against chip 24 in a manner similar to that described above for the other embodiments.

The particular size and shape used for arms 218, free ends 220, and the other parts of wire frame mounting assembly 214 may be varied depending on the location of any mounting bores 36. The components of wire frame 214 preferably all lie in the same plane, but arms 218 do not necessarily need to be of the same length, nor do they need to be evenly spaced from one another. The relative configuration of arms 218 and free ends 220 need only be sufficient to apply appropriate force to retaining clip 224 in order to cause thermal transfer interface 228 to bear upon chip 24 with sufficient force to permit transfer of heat away from chip 24.

Wire frame assembly 214 permits increased air flow as compared to, for example, mounting plates 50.

Figure 10A:
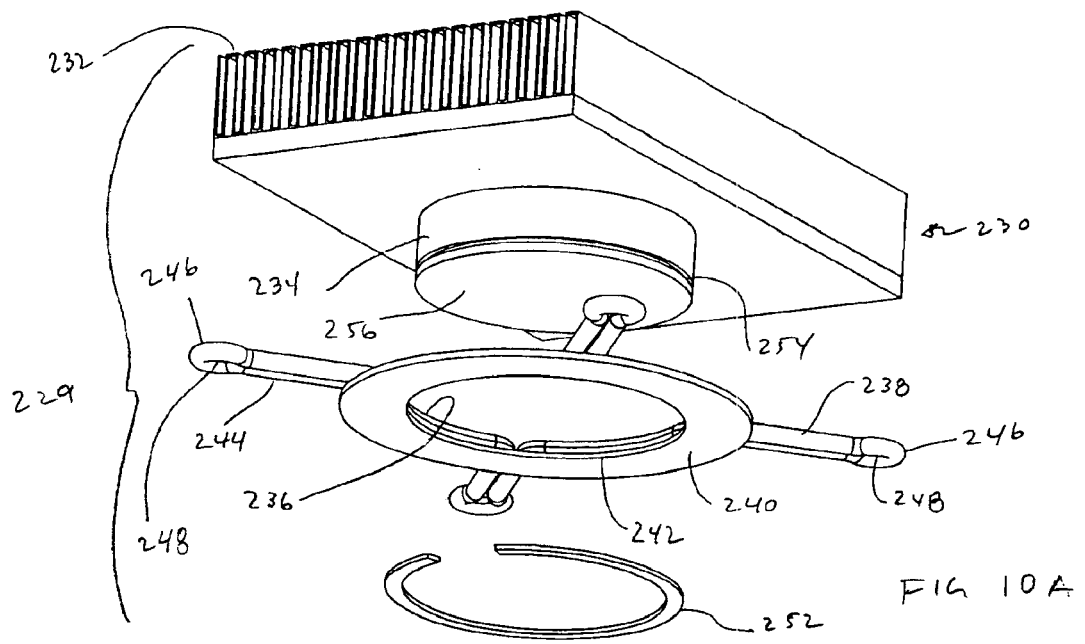
FIG. 10A is an exploded perspective view of a heat sink assembly according to an embodiment of the invention.
Figure 10B:
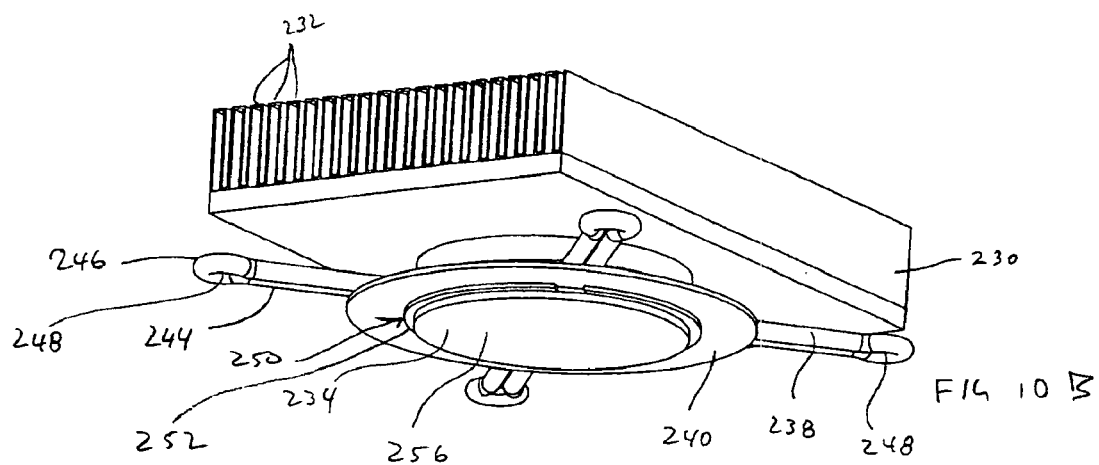
FIG. 10B is an assembled perspective view of the heat sink assembly of FIG. 10A.
Figure 10C:
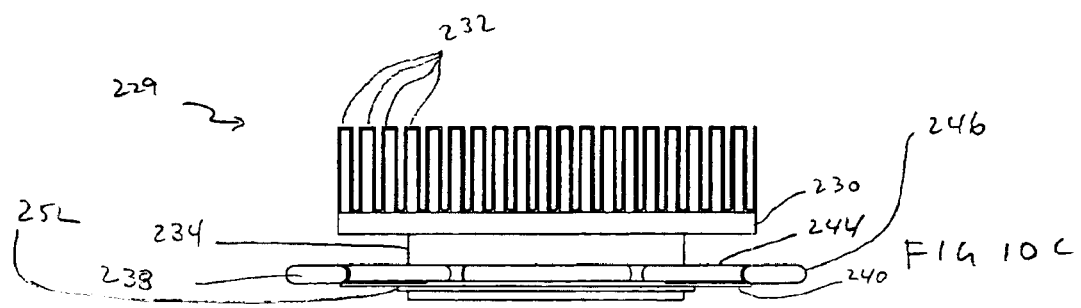
FIG. 10C is an assembled side view of the heat sink assembly of FIG. 10A.

Referring to FIGS. 10A to 10C, an embodiment of a heat sink assembly is shown generally as 229. Heat sink assembly 229 is similar to heat sink assembly 204. As will be noted from the various Figures, different heat sinks are shown in conjunction with the different embodiments. Operation of the various embodiments is generally not reliant on the type or configuration of heat sink used. However, some heat sink assemblies may more effectively use heat sinks having one configuration rather than another. For example, heat sink assembly 204 may be best used for installations requiring, or having, an air flow running generally parallel to a central axis of pedestal 210. Alternatively, the heat sink shown as part of heat sink assembly 40 may be more appropriately used for installations having a flow of air that is generally transverse to the axis of pedestal 60. Nevertheless, the various heat sinks shown in the various embodiments, and any other known heat sinks, may be applied to different embodiments as required.

Heat sink assembly 229 has a heat sink 230 which includes fins 232 and a pedestal 234. Pedestal 234 may be inserted through an opening 236 defined by a mounting assembly in the nature of a wire frame 238. Wire frame 238 is similar to wire frame 214. Wire frame 238 additionally includes a member in the nature of a plate, which is preferably an annular plate 240. Annular plate 240 has an opening 242 that generally corresponds to the size and shape of an opening 236 so that it permits passage of pedestal 234 therethrough. While annular plate 240 may be attached to either side of wire frame 238, it is preferably attached to a side of wire frame 238 opposite to heat sink 230. Wire frame 238 has arms 244, which have free ends 246 that define holes 248.

To assemble heat sink assembly 229, pedestal 234 is inserted through opening 236 and opening 242 of annular plate 240. Pedestal 234 is then retained by a retainer 250, which includes a clip 252 that engages a groove 254 of pedestal 234. Fasteners 32 are inserted through holes 248 and are tightened to secure heat sink assembly 229 to substrate 22. As fasteners are tightened, they bear on free ends 246 drawing them towards substrate 22. This causes thermal transfer interface 256 to bear against chip 24. As free ends 246 are forced towards substrate 22, annular plate 240, which is connected or otherwise mounted to wire frame 238, resists deflection of arms 244. This resistance serves to increase the force that may ultimately be applied by thermal transfer interface to chip 24. Annular plate 240 thereby increases the effective resilience of arms 244. Annular plate 240 may also serve to reinforce the structure of wire frame 238.

Figure 12B:
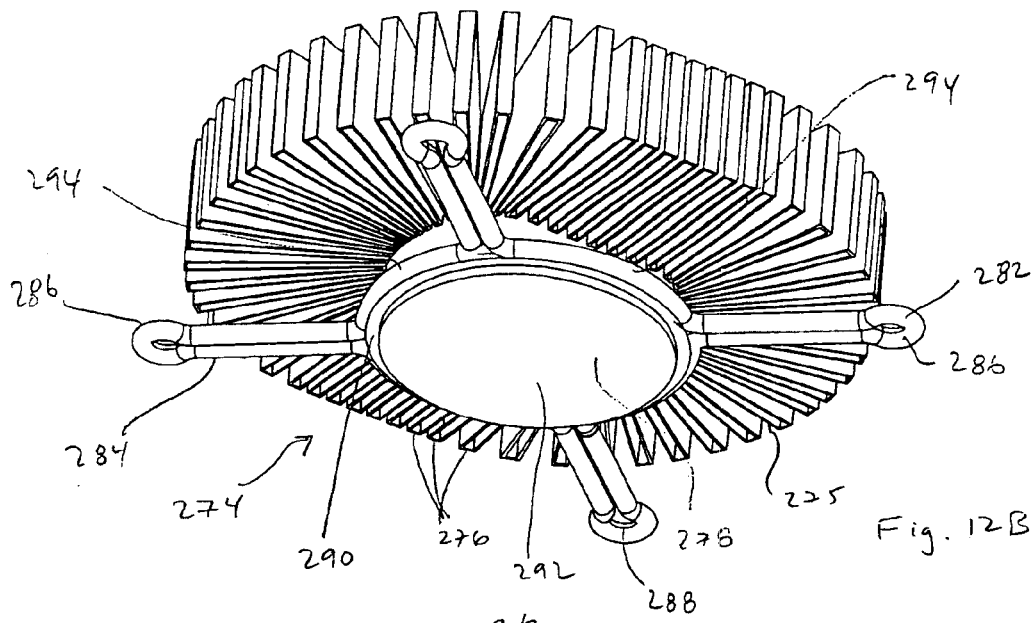
FIG. 12B is an assembled perspective view of the heat sink assembly of FIG. 12A.
Figure 12A:
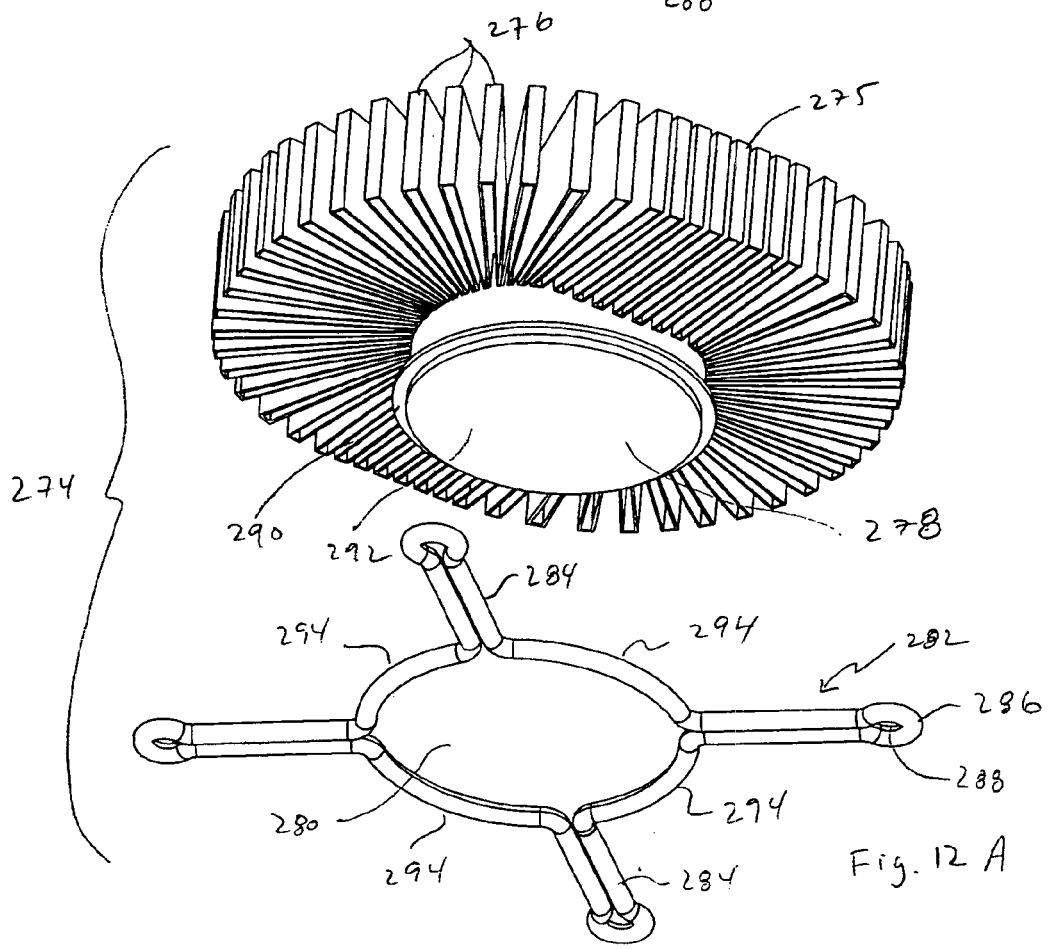
FIG. 12A is an exploded perspective view of a heat sink assembly according to an embodiment of the invention.

Referring to FIGS. 12A and 12B, an embodiment of a heat sink assembly is shown generally as 274. Heat sink assembly 274 is similar to heat sink assembly 204, but shares many of the features and advantages of the other embodiments described. In particular, heat sink assembly 274 includes a heat sink 275 having fins 276 and a pedestal 278. Heat sink assembly 274 differs from the other embodiments in that the retainer is integral with or fixed to pedestal 278. The retainer is identified by the reference numeral 290. As with heat sink assembly 274, a wire frame mounting assembly 282 is used to mount heat sink 275 to substrate 22.

Wire frame 282 may be formed from a single piece of wire, or some other appropriate material. Alternatively, it may be formed in sections which are inserted, welded or otherwise connected to one another.

Wire frame 282 defines an opening 280. Wire frame 282 has two or more arms 284, having arcuate free ends 286 defining holes 288. Holes 288 function in a similar manner to holes 58, and receive fasteners 32 for securing heat sink assembly 274 to substrate 22. When fasteners 32 are secured to substrate 22, arms 284 are caused to flex and bear down on retainer 290. This causes thermal transfer interface 292 to exert pressure against chip 24 in a manner similar to that described above for the other embodiments.

Wire frame 282 is mounted to pedestal 278 by applying a force to one or more of portions 294 which define opening 280. Force is applied to cause one or more of portions 294 to deform to permit passage of pedestal 278, together with retainer 290, through opening 280. Wire frame portions 294 are made of a flexible, and preferably resilient, material to permit such deformation, and to permit such portions 294 to return to their initial shape once retainer 290 is inserted through opening 280. Retainer 290 and wire frame 282 thus inhibit removal of pedestal 278.

Referring to FIGS. 13A to 13D, a further embodiment of a heat sink assembly is shown generally as 296. Heat sink assembly 296 operates in generally the same manner as described for heat sink assembly 40, and the other embodiments, except as described below. Heat sink assembly 296 includes a heat sink 298 having fins 300 and a pedestal 302. Pedestal 302 is positionable within an opening 304, which is defined by mounting plate 306. Pedestal 302 may be retained to mounting plate 306 by a retainer 308. In a similar manner as heat sink assembly 274, retainer 308 is integral with or fixed to pedestal 302.

Heat sink assembly 296 differs from the other embodiments described herein in that mounting plate 306 is separable into at least two sub-plates 306a and 306b. Each sub-plate 306a and 306b define at least a portion of opening 304. Each sub-plate is removably connectable to the other via connection features 310 and 312. Sub-plates 306a and 306b may be similar, as shown in FIGS. 13A to 13D, or they may be significantly different from one another. Having a similar configuration can reduce manufacturing costs.

In the present embodiment, connection feature 310 is similar to 312. Accordingly, only feature 310 is described herein. Feature 310 includes mating parts 310a and 310b, which maintain the resiliency of mounting plate 306 to a degree similar to the mounting plates of the other embodiments, including mounting plate 50. In the present embodiment, part 310a has a finger 314 which forms part of plate 306a; and part 310b includes a corresponding receptacle 316, which is formed in plate 306b, that mates with finger 314. Finger 314 may be stepped so that sub-parts 306a and 306b may be better integrated.

To mount plate 306 to pedestal 302, sub-plates 306a and 306b are positioned to either side of pedestal 302. Each sub-plate 306a is tilted to form an angle with the axis of pedestal 302. Each sub-plate 306 preferably forms a 45 degree angle with respect to the axis of pedestal 302 and also form a 90 degree angle relative to each other. Sub-plates 306a and 306b are then brought together and corresponding parts of connection features 310 and 312 are aligned and engaged. Sub-plates 306a and 306b are then moved into a common plane to fully engage such connection features and to engage pedestal 302 between retainer 308 and heat sink 298. Heat sink assembly may then be attached to substrate 22 in a manner similar to that described for the other embodiments.

It should be emphasised that the particular connection features employed may be different so long as mounting plate 306 may be at least partially separated (e.g., sub-parts 306a and 306b may be hinged) and then reconnected in order to engage pedestal 302, between retainer 308 and heat sink 298.

Figure 11:
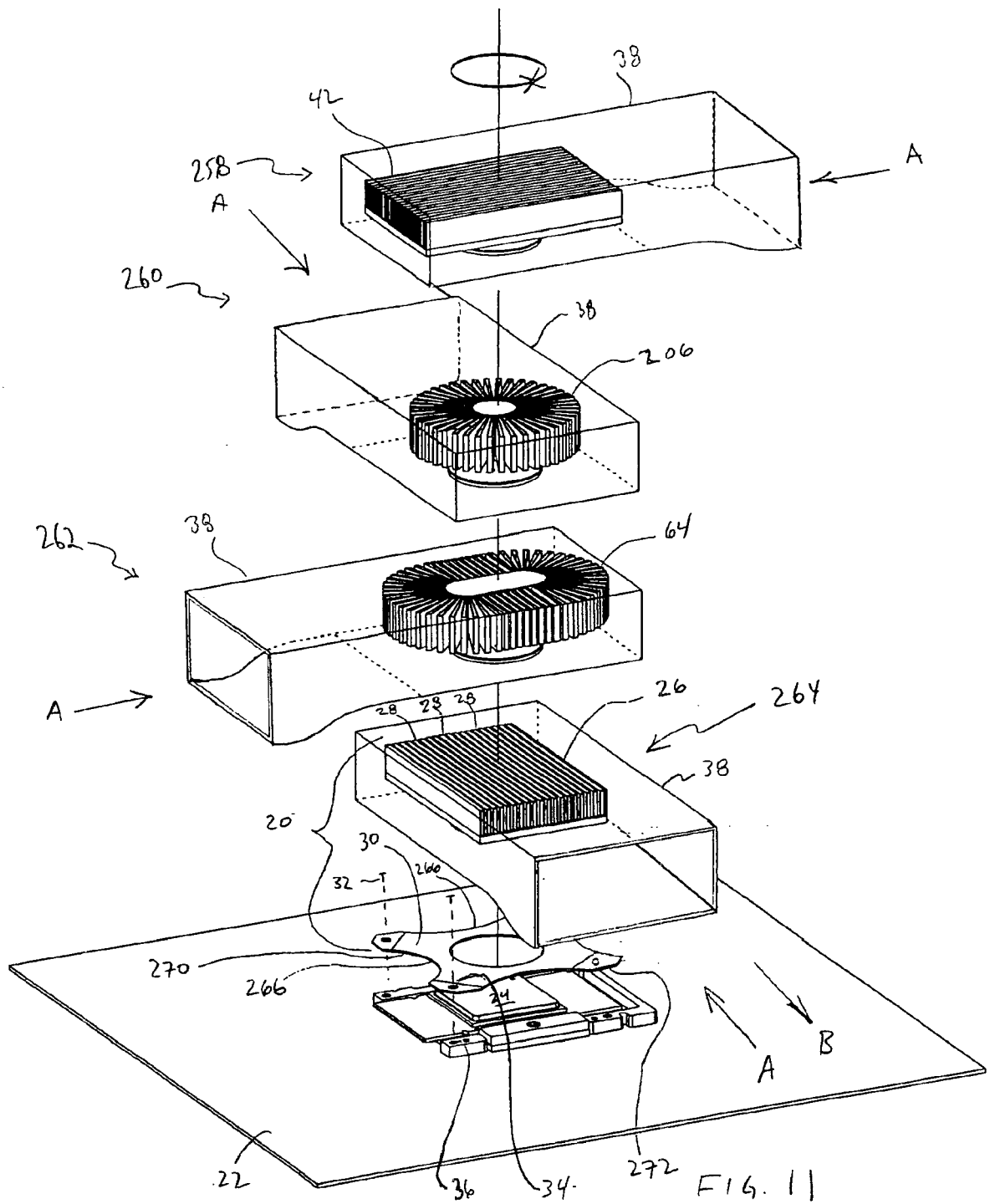
FIG. 11 is a perspective view of examples of various embodiments of the heat sink assembly

Referring to FIG. 11, a number of embodiments are illustrated. Each embodiment would be attached alone to substrate 22. They would not be attached all at the same time as suggested by the exploded view of FIG. 11. The four sample embodiments 258, 260, 262 and 264 are all shown in one figure for convenience.

Heat sink assembly 20 is the same as the assembly illustrated in FIG. 1. Mounting bracket 30 of heat sink assembly 20 is different than that described for the other embodiments. Mounting bracket 30 is somewhat similar to mounting bracket 50 shown in FIG. 2A, but it differs at least in that it has one or more cutaways 266 therein. Mounting plate 30 may also have bends or deflection points 268 at a point along an arm 270 thereof, adjacent to end 272. Bend 268 causes end 272 to lie outside of the plane of mounting plate 30, which also causes hole 34, which is located through end 272, to be outside of the plane of mounting plate 30 as well.

During installation, mounting plate 30 is preferably oriented so that ends 272 are oriented so that they deflect away from bores 36 as fasteners 32 are inserted through holes 34 and tightened into bores 36. Each fastener 32 bears down on deflected ends 272 drawing them closer to the opening of bore 36. This arrangement encourages the connection to act as a fixed joint that can carry a bending moment. As described for mounting plate 165, cutaways 266 serve to permit greater air flow about mounting plate 30 and increase the resiliency of arms 270.

Referring to embodiment 258, enclosure 38 may be rotated in concert with heat sink 42 to a convenient orientation. At the same time, mounting bracket 30 may retain its original orientation. Alternatively, when embodiment 258 is installed on a different substrate 22A, having a similar, but not identical, circuit and component arrangement thereon, enclosure 38 and heat sink 42 may be kept in a particular fixed orientation, and mounting plate 30 may be rotated to a position that is more convenient for mounting to substrate 22A.

Referring to embodiment 260, enclosure 38 may be rotated without the need to rotate heat sink 206 or mounting plate 30 to accommodate for different circuit and component arrangements on different substrates. Alternatively, mounting plate 30 may be rotated to a more convenient orientation while maintaining the orientation of enclosure 38. Since heat sink 206 is circular, rotation thereof will not affect thermal transfer.

Referring to embodiment 262, enclosure 38 and heat sink 64 may be oriented in a manner similar to that described for embodiment 258. Similarly, embodiment 264 may be manipulated in the manner similar to that described for embodiment 258.

In another embodiment, a heat sink, an enclosure for the heat sink and a mounting plate are provided. The mounting plate is formed and is fixed to a circuit board in a manner as described above. The enclosure is mounted about the mounting plate and may be oriented in a plurality of positions as described above. However, in the embodiment, the heat sink remains in a fixed position relative to the mounting plate as the enclosure is positioned in different orientations about the heat sink.

While the various embodiments have been described in relation to different embodiments of heat sinks, mounting plates, attachment assemblies, and other components, these components are generally interchangeable, depending on the needs of a particular installation. The particular combination of components in each embodiment are not limited to the combinations illustrated in the examples above.

Accordingly, those skilled in the art will appreciate that numerous modifications, adaptations and variations may be made to the embodiments without departing from the scope of the invention.

What is claimed is:

1. A heat sink assembly comprising:
   a heat sink;
      a bracket for mounting said heat sink to a component located on a circuit board, and
      retaining clip assembly to couple the heat sink to the bracket and allow rotation between the heat sink and the bracket thereby allowing said heat sink to be rotated to an installation orientation relative to said bracket prior to mounting said heat sink against said component.

2. The heat sink assembly of claim 1, wherein said heat sink further comprises a pedestal and said bracket further defines an opening, said retaining clip assembly co-operating with a groove in said pedestal and said opening to allow said heat sink to be rotated to said installation orientation.

3. The heat sink assembly of claim 2 wherein said bracket is mountable about said component to said circuit board.

4. The heat sink assembly of claim 2 wherein said retaining clip assembly comprises a penannular retaining clip cooperable with a groove in said pedestal and said bracket to retain said heat sink within said opening when said bracket is mounted to said circuit board.

5. The heat sink assembly of claim 4 further comprising a housing enclosing said heat sink therein, said housing having at least one open end.

6. The heat sink assembly of claim 5, wherein said housing is rotatable about said heat sink.

7. The heat sink assembly of claim 3, wherein said bracket further comprises a bevel directing airflow towards said heat sink.

8. The heat sink assembly of claim 7 wherein said bracket comprises stamped metal.

9. The heat sink assembly of claim 8 wherein said bracket is mountable about said component to said circuit board by a fastener securing a leaf on said bracket to said circuit board.

10. The heat sink assembly of claim 9 wherein said leaf is initially biased away from said circuit board prior to being secured to said circuit board by said fastener.

11. The heat sink assembly of claim 10, wherein a feature on said bracket cooperates with a feature on said pedestal to provide said installation orientation for said heat sink.

12. The heat sink assembly of claim 11, wherein said feature on said bracket is a key and said feature on said pedestal is a rebate.

13. The heat sink assembly of claim 11, wherein said feature on said pedestal is a key and said feature on said bracket is a rebate.

14. The heat sink assembly of claim 10, a feature on said bracket cooperates with a feature on said pedestal to inhibit rotation of said heat sink about said bracket in one direction.

15. The heat sink assembly of claim 14, wherein said feature on said pedestal is a key and said feature on said bracket is a raised flange.

16. The heat sink assembly of claim 10 wherein said bracket comprises formed wire.

17. A heat sink assembly comprising:
   a heat sink;
   a bracket for mounting said heat sink to a structure associated with a circuit board:
   a vane connected to said bracket for directing airflow; and
   a retaining clip assembly to retain said heat sink to said bracket,
   wherein said retaining clip assembly permits said heat sink to be rotated relative to said bracket prior to mounting said heat sink to said circuit board.

18. A heat sink assembly comprising:
   a heat sink;
   a housing enclosing said heat sink having at least one open end through which air is permitted to circulate;
   a bracket for mounting said heat sink and housing to a component located on a circuit board; and
   a retaining clip assembly to couple the heat sink and the housing to the bracket and allow rotation between the heat sink, the housing and the bracket thereby allowing said heat sink and said housing to be rotated to an installation orientation relative to said bracket prior to mounting said heat sink assembly against said component.

19. The heat sink assembly of claim 18, wherein said heat sink further comprises a pedestal and said bracket further defines an opening, said retaining assembly cooperating with said pedestal and said opening to allow said heat sink to be rotated to said installation orientation.

20. The heat sink assembly of claim 18 wherein said retaining clip assembly comprises a penannular retaining ring cooperable with said pedestal and said bracket to retain said heat sink within said opening when said bracket is mounted to said circuit board.

21. The heat sink assembly of claim 18 further including a vane to direct air flow over said heat sink.

* * * * *